United States Patent

Yun

(10) Patent No.: US 12,356,610 B2
(45) Date of Patent: Jul. 8, 2025

(54) SEMICONDUCTOR DEVICE

(71) Applicant: Samsung Electronics Co., Ltd., Suwon-si (KR)

(72) Inventor: Cheol Ju Yun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 530 days.

(21) Appl. No.: 17/743,779

(22) Filed: May 13, 2022

(65) Prior Publication Data

US 2023/0102747 A1 Mar. 30, 2023

(30) Foreign Application Priority Data

Sep. 27, 2021 (KR) .................. 10-2021-0126818

(51) Int. Cl.
*H10B 12/00* (2023.01)

(52) U.S. Cl.
CPC .............. *H10B 12/50* (2023.02); *H10B 12/09* (2023.02); *H10B 12/315* (2023.02)

(58) Field of Classification Search
CPC ...... H10B 12/50; H10B 12/09; H10B 12/315; H10B 12/033; H01L 28/90; H01L 28/60; H10D 1/716; H10D 1/692
USPC ...................................................... 257/296
See application file for complete search history.

(56) References Cited

U.S. PATENT DOCUMENTS

| 8,680,650 | B2 | 3/2014 | Freeman |
| 8,716,775 | B2 * | 5/2014 | Kim ............... H10B 12/033 |
| | | | 257/296 |
| 8,847,353 | B2 | 9/2014 | Hasunuma |
| 9,105,758 | B2 | 8/2015 | Kim |
| 9,548,300 | B2 | 1/2017 | Kim |
| 10,056,339 | B2 | 8/2018 | Jang et al. |
| 10,692,968 | B2 | 6/2020 | Lee et al. |
| 2017/0221543 | A1 | 8/2017 | Kim et al. |

FOREIGN PATENT DOCUMENTS

| KR | 20010048576 A | 6/2001 |
| KR | 20130072043 A | 7/2013 |
| KR | 20170031469 A | 3/2017 |

* cited by examiner

*Primary Examiner* — Tan N Tran
(74) *Attorney, Agent, or Firm* — Myers Bigel, P.A.

(57) ABSTRACT

A semiconductor device comprises, a substrate, a first capacitor structure including a plurality of first storage electrodes on the substrate, a first upper electrode on the first storage electrodes and a first capacitor dielectric layer between the plurality of first storage electrodes and the first upper electrode, and a first lower electrode between the first capacitor structure and the substrate and electrically connected with the first capacitor structure. The plurality of first storage electrodes include a first normal storage electrode and a first dummy storage electrode, which are spaced apart from each other. The first normal storage electrode is electrically connected with the first lower electrode, and the first dummy storage electrode is not electrically connected with the first lower electrode.

19 Claims, 32 Drawing Sheets

SEMICONDUCTOR DEVICE

CROSS-REFERENCE TO RELATED APPLICATION

This application claims priority from Korean Patent Application No. 10-2021-0126818 filed on Sep. 27, 2021 in the Korean Intellectual Property Office and all the benefits accruing therefrom under 35 U.S.C. 119, the contents of which in its entirety are herein incorporated by reference.

FIELD

The present disclosure relates to semiconductor devices.

BACKGROUND

In electrical and electronic devices, capacitors have been used for various purposes. For example, capacitors have been used as a memory element in a semiconductor memory device such as a DRAM. As another example, in a semiconductor device, capacitors can serve as an energy storage locally storing electrical energy, and thus may be used to implement a decoupling circuit that reduces or prevents noise caused in one portion of the semiconductor device from affecting the other portions of the semiconductor device.

Meanwhile, as an aspect ratio of a capacitor is increased, bending of the capacitor may occur in an edge region of the semiconductor device. As such, insulation characteristics may be degraded, and leakage current may be generated when a voltage is applied to the capacitor.

SUMMARY

Some embodiments of the present disclosure provide a semiconductor device with improved performance and reliability.

Embodiments of the present disclosure are not limited to those mentioned above and additional embodiments of the present disclosure, which are not mentioned herein, will be clearly understood by those skilled in the art from the following description of the present disclosure.

According to an aspect of the present disclosure, there is provided a semiconductor device comprising a substrate, a first capacitor structure including a plurality of first storage electrodes on the substrate, a first upper electrode on the plurality of first storage electrodes, and a first capacitor dielectric layer between the plurality of first storage electrodes and the first upper electrode, and a first lower electrode between the first capacitor structure and the substrate and connected with the first capacitor structure. The plurality of first storage electrodes include a first normal storage electrode and a first dummy storage electrode, which are spaced apart from each other, the first normal storage electrode is electrically connected with the first lower electrode, and the first dummy storage electrode is not electrically connected with the first lower electrode.

According to another aspect of the present disclosure, there is provided a semiconductor device comprising a substrate including a first region and a second region surrounding the first region, a capacitor structure including a plurality of storage electrodes on the substrate, an upper electrode on plurality of the storage electrodes, and a capacitor dielectric layer between the plurality of storage electrodes and the upper electrode, and a lower electrode between the capacitor structure and the first region of the substrate and electrically connected with the capacitor structure. The plurality of storage electrodes includes a normal storage electrode on the first region of the substrate and electrically connected with the lower electrode, and a dummy storage electrode on the second region of the substrate and electrically floating.

According to another aspect of the present disclosure, there is provided a semiconductor device comprising a substrate including a cell array region and a peripheral region, bit lines on and crossing the cell array region of the substrate, a buried contact between the bit lines and electrically connected with the cell array region of the substrate, a landing pad on the buried contact, a cell capacitor structure on and electrically connected with the landing pad, a peripheral capacitor structure including a plurality of peripheral storage electrodes on the peripheral region of the substrate, a peripheral upper electrode on the plurality of peripheral storage electrodes, and a peripheral capacitor dielectric layer between the plurality of peripheral storage electrodes and the peripheral upper electrode, a peripheral lower electrode between the peripheral capacitor structure and the peripheral region of the substrate and connected with the peripheral capacitor structure, and a peripheral common electrode between the lower electrode and the peripheral region of the substrate. An area of the peripheral lower electrode is smaller than an area of the peripheral common electrode in plan view, the plurality of peripheral storage electrodes include a peripheral normal storage electrode and a peripheral dummy storage electrode, which are spaced apart from each other, the peripheral normal storage electrode is electrically connected with the peripheral lower electrode, and the peripheral dummy storage electrode is not electrically connected with the peripheral lower electrode.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF EMBODIMENTS

Figure 1:
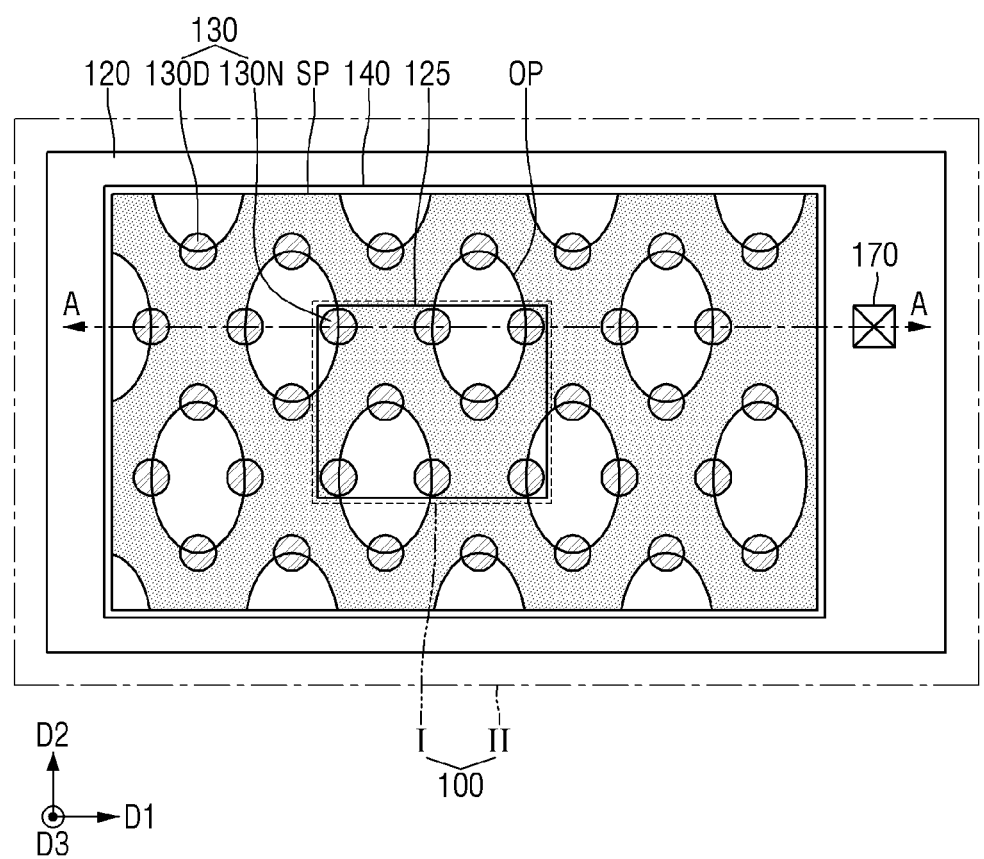
FIG. 1 is a plan view schematically illustrating a semiconductor device according to some embodiments.

Hereinafter, the present disclosure will be described in more detail with reference to the accompanying drawings according to some embodiments.

Although a dynamic random access memory (DRAM) is shown in the drawing related to a semiconductor device according to some embodiments by way of example, the present disclosure is not limited thereto.

Figure 2:
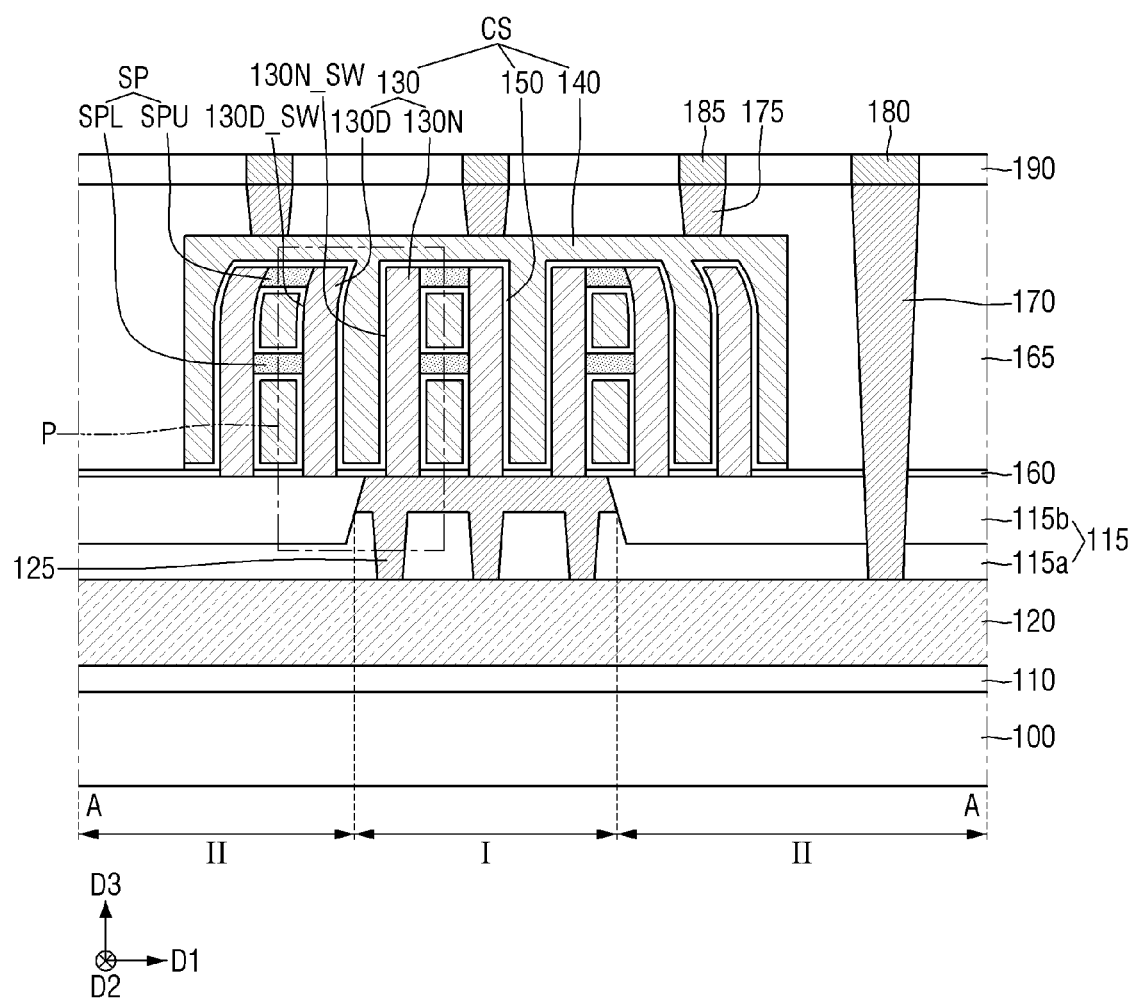
FIG. 2 is a cross-sectional view taken along line A-A of FIG. 1.
Figure 3:
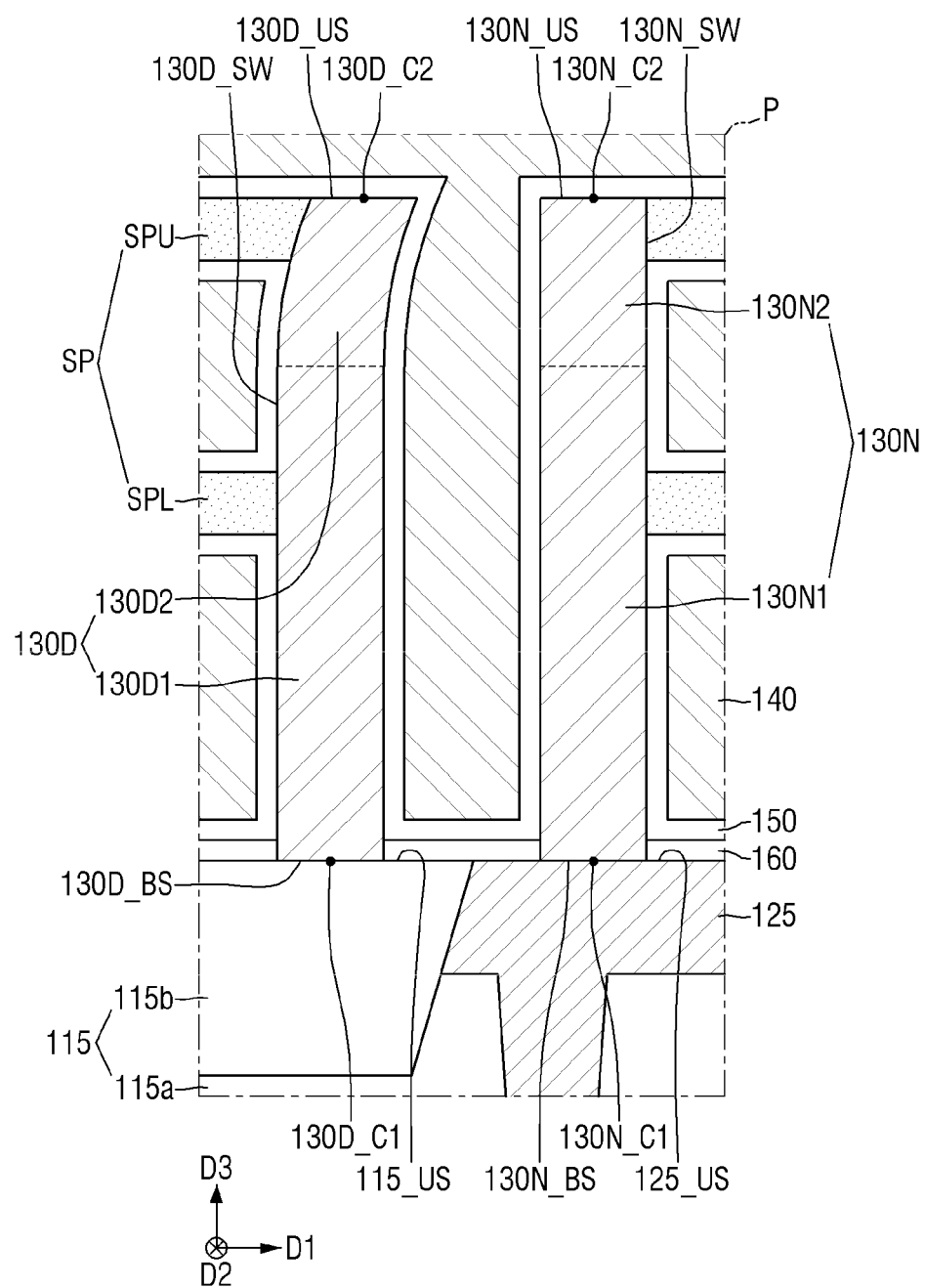
FIG. 3 is an enlarged view of a region P of FIG. 2.

FIG. 1 is a plan view schematically illustrating a semiconductor device according to some embodiments. FIG. 2 is a cross-sectional view taken along line A-A of FIG. 1. FIG. 3 is an enlarged view of a region P of FIG. 2.

Referring to FIGS. 1 to 3, a semiconductor device according to some embodiments may include a substrate 100, a first interlayer insulating layer 110, a common electrode 120, a lower electrode 125, a second interlayer insulating layer 115, a capacitor structure CS, a support layer SP, and a first contact 170.

The substrate 100 includes a first region I, and a second region II. The first region I may be defined by the second region II. The second region II may surround the first region I. The first region I may be a center region, and the second region II may be an edge region.

The substrate 100 may be, for example, a silicon single crystal substrate or a silicon on insulator (SOI) substrate. Otherwise, the substrate 100 may include silicon germanium, silicon germanium on insulator (SGOI), indium antimonide, lead telluride compound, indium arsenide, indium phosphide, gallium arsenide or gallium antimonide, but is not limited thereto.

The first interlayer insulating layer 110 may be disposed on the substrate 100. The first interlayer insulating layer 110 may be disposed between the substrate 100 and the common electrode 120. The first interlayer insulating layer 110 may include an insulating material. The first interlayer insulating layer 110 may be disposed between the substrate 100 and the common electrode 120 to insulate the substrate 100 from the common electrode 120. The first interlayer insulating layer 110 may be a single layer, but is not limited thereto. The first interlayer insulating layer 110 may be a multi-layer. The first interlayer insulating layer 110 may include at least one of, for example, a silicon oxide layer, a silicon nitride layer, a silicon oxynitride layer, or combinations thereof.

The common electrode 120 is disposed on the substrate 100. The common electrode 120 is disposed on the first interlayer insulating layer 110. The common electrode 120 may extend in a first direction D1 and a second direction D2 on a plane where the first direction D1 and the second direction D2 are extended. The common electrode 120 may include, but is not limited to, a long side extended in the first direction D1 and a short side extended in the second direction D2. In this specification, the first direction D1 and the second direction D2 cross each other. The first direction D1 and the second direction D2 may substantially be perpendicular to each other. A third direction D3 may substantially be perpendicular to the first direction D1 and the second direction D2.

The common electrode 120 may include a conductive material. The common electrode 120 may electrically be connected with the capacitor structure CS. The common electrode 120 may directly be connected with the lower electrode 125. The lower electrode 125 may directly be connected with the capacitor structure CS. As used herein, when elements or layers are "directly" connected, no intervening elements or layers are present. The common electrode 120 may be a single layer, but is not limited thereto. The common electrode 120 may be a multi-layer. The common electrode 120 may include, but is not limited to, polysilicon, TiSiN, tungsten (W), and combinations thereof.

In FIG. 1, an area of the common electrode 120 is greater than an area of the lower electrode 125 in plan view. The lower electrode 125 is completely overlapped with the common electrode 120 in the third direction D3. The area of the common electrode 120 is greater than an area of the upper electrode 140. The upper electrode 140 may completely be overlapped with the common electrode 120 in the third direction D3. The width of the common electrode 120 in the second direction D2 may be greater than that of the upper electrode 140 in the second direction D2. In addition, the width of the common electrode 120 in the first direction D1 may be greater than that of the upper electrode 140 in the first direction D1. The common electrode 120 may include a portion that is not overlapped with the upper electrode 140 in the third direction D3.

The second interlayer insulating layer 115 may be disposed on the common electrode 120. The second interlayer insulating layer 115 may be disposed between the capacitor structure CS and the common electrode 120. The second interlayer insulating layer 115 may be disposed between the third interlayer insulating layer 165 and the common electrode 120. The second interlayer insulating layer 115 may be a multi-layer that includes a second lower interlayer insulating layer 115a and a second upper interlayer insulating layer 115b, but embodiments of the present disclosure are not limited thereto. The second interlayer insulating layer 115 may be a single layer.

Each of the second lower interlayer insulating layer 115a and the second upper interlayer insulating layer 115b may include an insulating material. For example, each of the second lower interlayer insulating layer 115a and the second upper interlayer insulating layer 115b may include at least one of a silicon nitride layer, a silicon oxynitride layer, a silicon oxide layer, or combinations thereof.

The lower electrode 125 is disposed on the substrate 100. The lower electrode 125 is disposed on the first region I of the substrate 100. The lower electrode 125 may completely be overlapped with the first region I of the substrate 100 in the third direction D3. The lower electrode 125 is disposed on the common electrode 120. The lower electrode 125 may be disposed in the second interlayer insulating layer 115. The lower electrode 125 is disposed between the capacitor structure CS and the substrate 100. The lower electrode 125 is disposed between the capacitor structure CS and the common electrode 120. The lower electrode 125 may be disposed between the capacitor structure CS and the common electrode 120 to electrically connect the capacitor structure CS with the common electrode 120.

The lower electrode 125 is in contact with a normal storage electrode 130N. The lower electrode 125 is electrically connected with the normal storage electrode 130N. The lower electrode 125 is not in contact with the dummy storage electrode 130D. The lower electrode 125 is not electrically connected with a dummy storage electrode 130D.

The lower electrode 125 may include a conductive material. The lower electrode 125 may include, but is not limited to, at least one of tungsten (W), a titanium nitride (TiN) layer or combinations thereof. In contrast to the illustrated example, the lower electrode 125 may be a multi-layer. When the lower electrode 125 is a multi-layer, the lower electrode 125 may include a barrier layer and a filling layer. The barrier layer may be, for example, a titanium nitride layer, and the filling layer may be, for example, tungsten.

In FIG. 1, the area of the lower electrode 125 is less than the area of the upper electrode 140 in plan view. The lower electrode 125 is completely overlapped with the upper electrode 140 in the third direction D3.

In FIG. 3, an upper surface 125_US of the lower electrode 125 is coplanar with an upper surface 115_US of the second interlayer insulating layer 115. An upper surface 115_US of the second interlayer insulating layer 115 may be an upper surface of the second upper interlayer insulating layer 115b. The second upper interlayer insulating layer 115b may be formed by etching a portion of the lower electrode 125. A portion of the lower electrode 125 may be etched to form a trench, and the second upper interlayer insulating layer 115b may fill the trench. Therefore, the upper surface 125_US of the lower electrode 125 may be on the substantially same level as the upper surface 115_US of the second interlayer insulating layer 115.

The semiconductor device according to some embodiments may further include an etch stop layer 160. The etch stop layer 160 may be disposed on the second interlayer insulating layer 115 and the lower electrode 125. The etch stop layer 160 may extend along the upper surface 115_US of the second interlayer insulating layer 115 and the upper surface 125_US of the lower electrode 125. The etch stop layer 160 may include at least one of a silicon nitride layer, a silicon carbonitride layer, a silicon boron nitride (SiBN) layer, a silicon oxynitride layer or a silicon oxycarbide layer.

The capacitor structure CS may be disposed on the second interlayer insulating layer 115 and the lower electrode 125. The capacitor structure CS may electrically be connected with the lower electrode 125. A portion of the capacitor structure CS may be disposed in the etch stop layer 160. The capacitor structure CS may include a storage electrode 130, an upper electrode 140, and a capacitor dielectric layer 150.

The plurality of storage electrodes 130 include a plurality of dummy storage electrodes 130D and a plurality of normal storage electrodes 130N. The dummy storage electrode 130D is disposed on the second region II of the substrate 100. The normal storage electrode 130N is disposed on the first region I of the substrate 100. Although seven storage electrodes 130 are shown as being disposed on the substrate 100 in the cross-section of FIG. 2, this is only for convenience of description, but the number of storage electrodes 130 is not limited thereto.

The dummy storage electrode 130D is not electrically connected with the lower electrode 125. The dummy storage electrode 130D is connected with the second interlayer insulating layer 115. The dummy storage electrode 130D may be electrically floated, that is, configured to have an electrically floating state during operation of the semiconductor device, also referred to herein as electrically floating.

In some embodiments, the dummy storage electrode 130D may have a structure that is bent toward the normal storage electrode 130N. The dummy storage electrode 130D may be tilted toward the normal storage electrode 130N. For example, a slope of the dummy storage electrode 130D may gradually be reduced as the dummy storage electrode 130D becomes far away from the second interlayer insulating layer 115. That is, a slope of a sidewall 130D_SW of the dummy storage electrode 130D may gradually be reduced as the sidewall 130D_SW of the dummy storage electrode 130D becomes far away from the second interlayer insulating layer 115. In other words, the dummy storage electrode may be curved toward the normal storage electrode 130N with distance from the second interlayer insulating layer 115.

In some embodiments, the outermost dummy storage electrode 130D may be more tilted or curved than the dummy storage electrode 130D nearest to the normal storage electrode 130N. The slope of the dummy storage electrode 130D may gradually be increased toward the normal storage electrode 130N from the outermost portion, but is not limited thereto.

In FIG. 2, the dummy storage electrode 130D to the left of the normal storage electrode 130N may be tilted or curved toward the right as the dummy storage electrode 130D becomes far away from the second interlayer insulating layer 115. The dummy storage electrode 130D to the right of the normal storage electrode 130N may be tilted or curved toward the left as the dummy storage electrode 130D becomes far away from the second interlayer insulating layer 115.

In FIG. 3, the dummy storage electrode 130D may include a first surface 130D_BS and a second surface 130D_US. The first surface 130D_BS may be a lower surface of the dummy storage electrode 130D, and the second surface 130D_US may be an upper surface of the dummy storage electrode 130D. The first surface 130D_BS may be a surface facing the substrate 100. The second surface 130D_US may be a surface facing the first surface 130D_BS.

In some embodiments, the first surface 130D_BS and the second surface 130D_US may be misaligned in a vertical direction (e.g., in a direction perpendicular to the substrate 100, shown as the third direction D3). In contrast, when a center 130D_C1 of the first surface 130D_BS and a center 130D_C2 of the second surface 130D_US are overlapped with each other in the third direction D3, the center 130D_C1 of the first surface 130D_BS and the center 130D_C2 of the second surface 130D_US may be determined to have been aligned; likewise, the first surface 130D_BS and the second surface 130D_US may be determined to have also been aligned when the respective centers 130D_C1 and 130D_C2 are aligned.

In FIG. 3, the center 130D_C1 of the first surface 130D_BS is not overlapped with the center 130D_C2 of the second surface 130D_US in the third direction D3. That is, the center 130D_C1 of the first surface 130D_BS is misaligned with the center 130D_C2 of the second surface 130D_US. In this case, the first surface 130D_BS and the second surface 130D_US may be determined to have been misaligned. A virtual straight line connecting the center 130D_C1 of the first surface 130D_BS with the center 130D_C2 of the second surface 130D_US may extend in a random direction different from the third direction D3.

The dummy storage electrode 130D may include a first portion 130D1 and a second portion 130D2. The first portion 130D1 of the dummy storage electrode 130D may be a portion directly connected with the second interlayer insulating layer 115. The second portion 130D2 of the dummy storage electrode 130D may be a portion disposed on the first portion 130D1 of the dummy storage electrode 130D.

In some embodiments, a slope of the first portion 130D1 of the dummy storage electrode 130D and a slope of the second portion 130D2 of the dummy storage electrode 130D may be different from each other. For example, the first portion 130D1 of the dummy storage electrode 130D may extend in a direction parallel with the third direction D3, and the second portion 130D2 of the dummy storage electrode 130D may extend in a random direction different from the third direction D3 to be closer to the normal storage electrode 130N.

The normal storage electrode 130N is electrically connected with the lower electrode 125. The plurality of normal storage electrodes 130N may electrically be connected with one another in parallel. The normal storage electrode 130N is not connected with the second interlayer insulating layer 115.

In some embodiments, the normal storage electrode 130N may extend in the third direction D3. The normal storage electrode 130N may have a structure that is not bent, e.g., a substantially linear structure. A sidewall 130N_SW of the normal storage electrode 130N may extend in a direction parallel with the third direction D3.

In FIG. 3, the normal storage electrode 130N may include a third surface 130N_BS and a fourth surface 130N_US. The third surface 130N_BS may be a lower surface of the normal storage electrode 130N, and the fourth surface 130N_US may be an upper surface of the normal storage electrode 130N. The third surface 130N_BS may be a surface facing the substrate 100. The fourth surface 130N_US may be a surface facing the third surface 130N_BS.

The third surface 130N_BS and the fourth surface 130N_US may be aligned. A center 130N_C1 of the third surface 130N_BS is overlapped with a center 130N_C2 of the fourth surface 130N_US in the third direction D3. That is, the center 130N_C1 of the third surface 130N_BS is aligned with the center 130N_C2 of the fourth surface 130N_US. A virtual straight line connecting the center 130N_C1 of the third surface 130N_BS with the center 130N_C2 of the fourth surface 130N_US may extend in a direction parallel with the third direction D3.

The normal storage electrode 130N may include a first portion 130N1 and a second portion 130N2. The first portion 130N1 of the normal storage electrode 130N may be a portion electrically connected with the lower electrode 125. The second portion 130N2 of the normal storage electrode 130N may be a portion disposed on the first portion 130N1 of the normal storage electrode 130N.

In some embodiments, a slope of the first portion 130N1 of the normal storage electrode 130N and a slope of the second portion 130N2 of the normal storage electrode 130N may be the same as each other. For example, the first portion 130N1 of the normal storage electrode 130N and the second portion 130N2 of the normal storage electrode 130N may extend in a direction parallel with the third direction D3.

The dummy storage electrode 130D and the normal storage electrode 130N are shown as having a pillar shape, but are not limited thereto. The dummy storage electrode 130D and the normal storage electrode 130N may have a cylindrical shape.

As an aspect ratio of the storage electrode 130 is increased, bending may occur in the storage electrode 130 disposed in the edge region, for example, the dummy storage electrode 130D. When the dummy storage electrodes 130D that are bent are electrically connected with each other, insulation characteristics of the capacitor dielectric layer 150 disposed on the dummy storage electrode 130D may be degraded, and a leakage current between the storage electrodes 130 may be generated. The semiconductor device according to some embodiments of the present disclosure may improve the performance and reliability of the semiconductor device by electrically floating the dummy storage electrode 130D in which bending is generated.

The upper electrode 140 may be disposed on the storage electrode 130. The upper electrode 140 may surround an outer wall of the storage electrode 130. The upper electrode 140 may surround outer walls of the dummy storage electrode 130D and the normal storage electrode 130N. The upper electrode 140 may be formed on a portion of the first region I and the second region II of the substrate 100. In plan view, the area of the upper electrode 140 may be greater than the area of the lower electrode 125.

The capacitor dielectric layer 150 may be disposed between the upper electrode 140 and the storage electrode 130. The capacitor dielectric layer 150 may be disposed along a profile of the storage electrode 130, e.g., conformally extending along surfaces of the normal storage electrode 130N and/or the dummy storage electrodes 130D.

Each of the storage electrode 130 and the upper electrode 140 may include, for example, a doped semiconductor material, a conductive metal nitride (e.g., titanium nitride, tantalum nitride, niobium nitride or tungsten nitride), a metal (e.g., ruthenium, iridium, titanium or tantalum), and/or a conductive metal oxide (e.g., iridium oxide or niobium oxide), but is not limited thereto.

The capacitor dielectric layer 150 may include at least one of, for example, silicon oxide, silicon nitride, silicon oxynitride, a high dielectric constant material, or combinations thereof, but is not limited thereto. In the semiconductor device according to some embodiments, the capacitor dielectric layer 150 may include a stacked layer structure in which zirconium oxide, aluminum oxide and zirconium oxide are sequentially stacked. In the semiconductor device according to some embodiments, the capacitor dielectric layer 150 may include a dielectric layer containing hafnium (Hf). In the semiconductor device according to some embodiments, the capacitor dielectric layer 150 may have a stacked layer structure of a ferroelectric material layer and a paraelectric material layer.

The support layer SP may structurally support the plurality of storage electrodes 130. The support layer SP may include a lower support layer SPL and an upper support layer SPU. The lower support layer SPL and the upper support layer SPU may be spaced apart from each other in the third direction D3. The support layer SP may include a plurality of openings OP. A closed curve for defining each of the openings OP may be connected with the center of four storage electrodes 130 adjacent to one another, but embodiments of the present disclosure are not limited thereto.

The support layer SP may include at least one of, for example, silicon nitride (SiN), silicon carbonitride (SiCN), silicon boron nitride (SiBN), silicon carbon oxide (SiCO), silicon oxynitride (SiON), or silicon oxycarbonitride (SiOCN).

The semiconductor device according to some embodiments may further include a third interlayer insulating layer 165. The third interlayer insulating layer 165 may be disposed on the etch stop layer 160. The third interlayer insulating layer 165 may cover the capacitor structure CS. The upper surface of the capacitor structure CS may be lower than that of the third interlayer insulating layer 165.

The third interlayer insulating layer 165 may include at least one of, for example, silicon oxide, silicon nitride, silicon oxynitride, or a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyClo-TetraSiloxane (OMCTS), HexaMethylDiSiloxane (HMDS), TriMethylSilyl Borate (TMSB), DiAcetoxyDitertiaryButo-Siloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluorinated Carbon, silica aerogels, silica xerogels, mesoporous silica or combinations thereof, but is not limited thereto.

The first contact 170 may be disposed on the common electrode 120. The first contact 170 may be disposed on a portion of the common electrode 120 that is not overlapped with the upper electrode 140 in the third direction D3. The first contact 170 may be electrically connected with the common electrode 120. The first contact 170 may electrically be connected with the common electrode 120 by passing through the third interlayer insulating layer 165, the etch stop layer 160 and the second interlayer insulating layer 115. In some embodiments, a ground voltage may be applied through the first contact 170.

The first contact 170 may include at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), or combinations thereof.

The semiconductor device according to some embodiments may further include a second contact 175. The second contact 175 may be electrically connected with the capacitor structure CS. The second contact 175 may electrically be connected with the upper electrode 140 of the capacitor structure CS. The second contact 175 may electrically be connected with the normal storage electrode 130N of the capacitor structure CS. The second contact 175 may pass through the third interlayer insulating layer 165. In some embodiments, a power voltage may be applied through the second contact 175.

The second contact 175 may include at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), or combinations thereof.

The semiconductor device according to some embodiments may further include a fourth interlayer insulating layer 190, a first wiring pattern 180 and a second wiring pattern 185.

The fourth interlayer insulating layer 190 may be disposed on the third interlayer insulating layer 165. The fourth interlayer insulating layer 190 may be disposed on the first contact 170 and the second contact 175. The fourth interlayer insulating layer 190 may be, for example, a silicon oxide layer, but is not limited thereto.

The first wiring pattern 180 and the second wiring pattern 185 may be disposed in the fourth interlayer insulating layer 190. The first wiring pattern 180 may be electrically connected with the first contact 170, and the second wiring pattern 185 may be electrically connected with the second contact 175. Each of the first wiring pattern 180 and the second wiring pattern 185 may include a conductive material. For example, each of the first wiring pattern 180 and the second wiring pattern 185 may include at least one of tungsten (W), copper (Cu) or aluminum (Al), but is not limited thereto.

Figure 4:
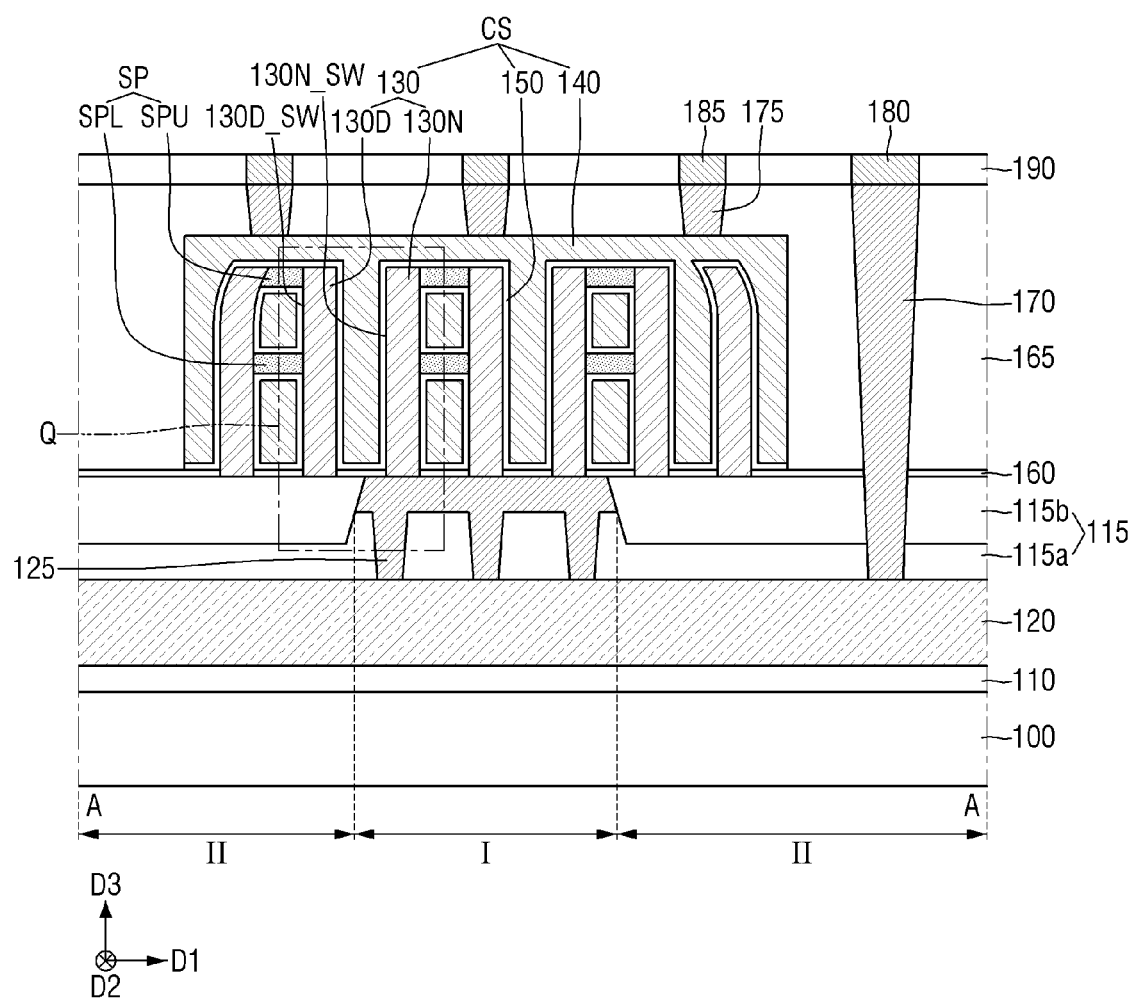
FIG. 4 is an example cross-sectional view illustrating a semiconductor device according to some embodiments.
Figure 5:
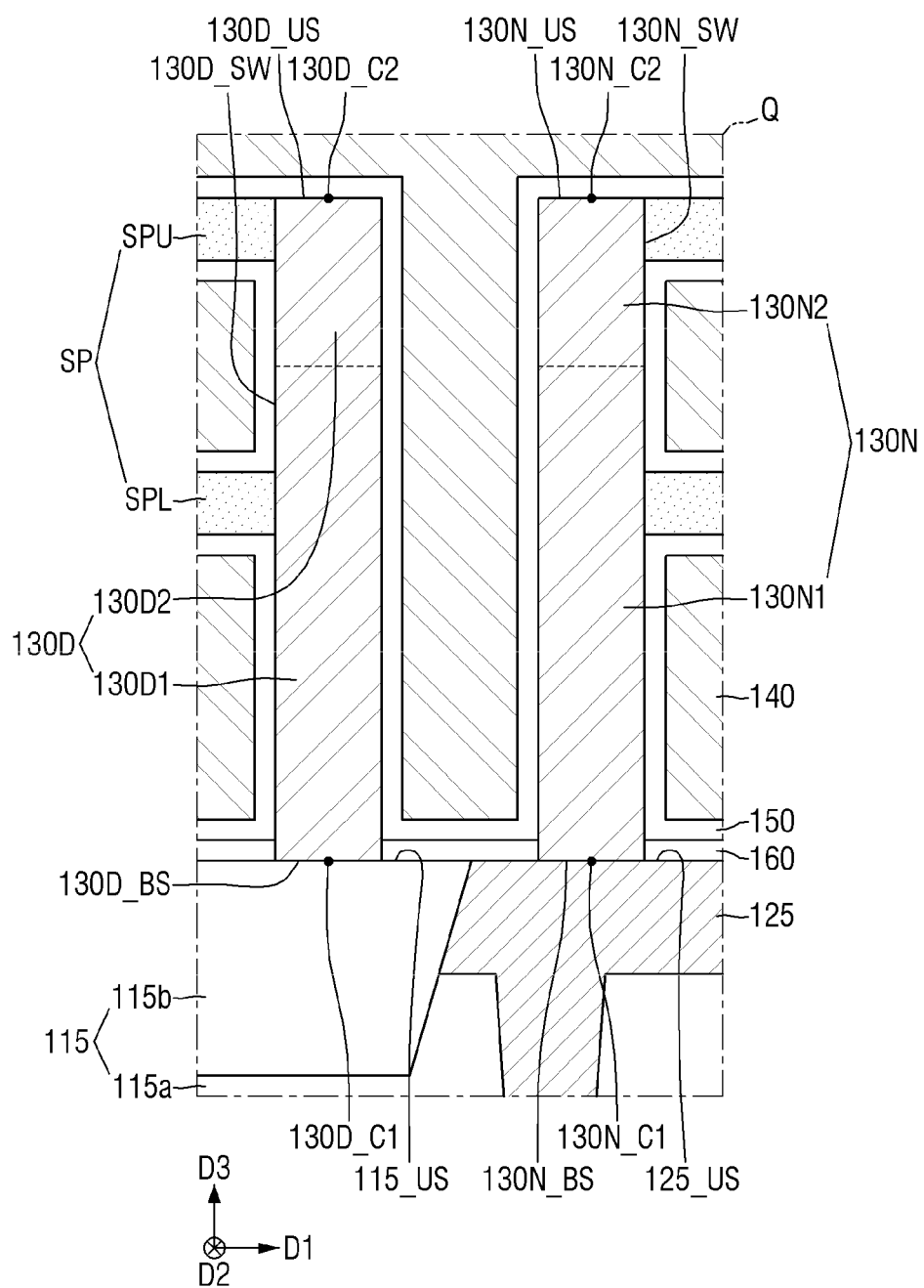
FIG. 5 is an enlarged view illustrating a region Q of FIG. 4.

FIG. 4 is an example cross-sectional view illustrating a semiconductor device according to some embodiments. FIG. 5 is an enlarged view illustrating a region Q of FIG. 4. For convenience of description, the following description will be based on a difference from that made with reference to FIGS. 1 to 3.

Referring to FIGS. 4 and 5, a portion of one or more of the dummy storage electrodes 130D may have a structure that is not bent, e.g., a substantially linear structure.

The dummy storage electrode 130D nearest to the normal storage electrode 130N may have a structure that is not bent. The dummy storage electrode 130D disposed at the outermost may have a structure that is bent toward the normal storage electrode 130N.

A portion of the storage electrode 130 overlapped with the second region II of the substrate 100 in the third direction D3 may extend in a direction parallel with the third direction D3.

In FIG. 5, a center 130D_C1 of the first surface 130D_BS of the dummy storage electrode 130D nearest to the normal storage electrode 130N and a center 130D_C2 of the second surface 130D_US may be aligned. That is, the center 130D_C1 of the first surface 130D_BS and the center 130D_C2 of the second surface 130D_US may completely be overlapped with each other in the third direction D3. A virtual straight line for connecting the center 130D_C1 of the first surface 130D_BS with the center 130D_C2 of the second surface 130D_US may extend in a direction parallel with the third direction D3.

The sidewall 130D_SW of the dummy storage electrode 130D nearest to the normal storage electrode 130N may extend in the third direction D3. The slopes of the first portion 130D1 and the second portion 130D2 of the dummy storage electrode 130D nearest to the normal storage electrode 130N may be the same as each other. The first portion 130D1 and the second portion 130D2 of the dummy storage electrode 130D nearest to the normal storage electrode 130N may extend in a direction parallel with the third direction D3.

Figure 6:
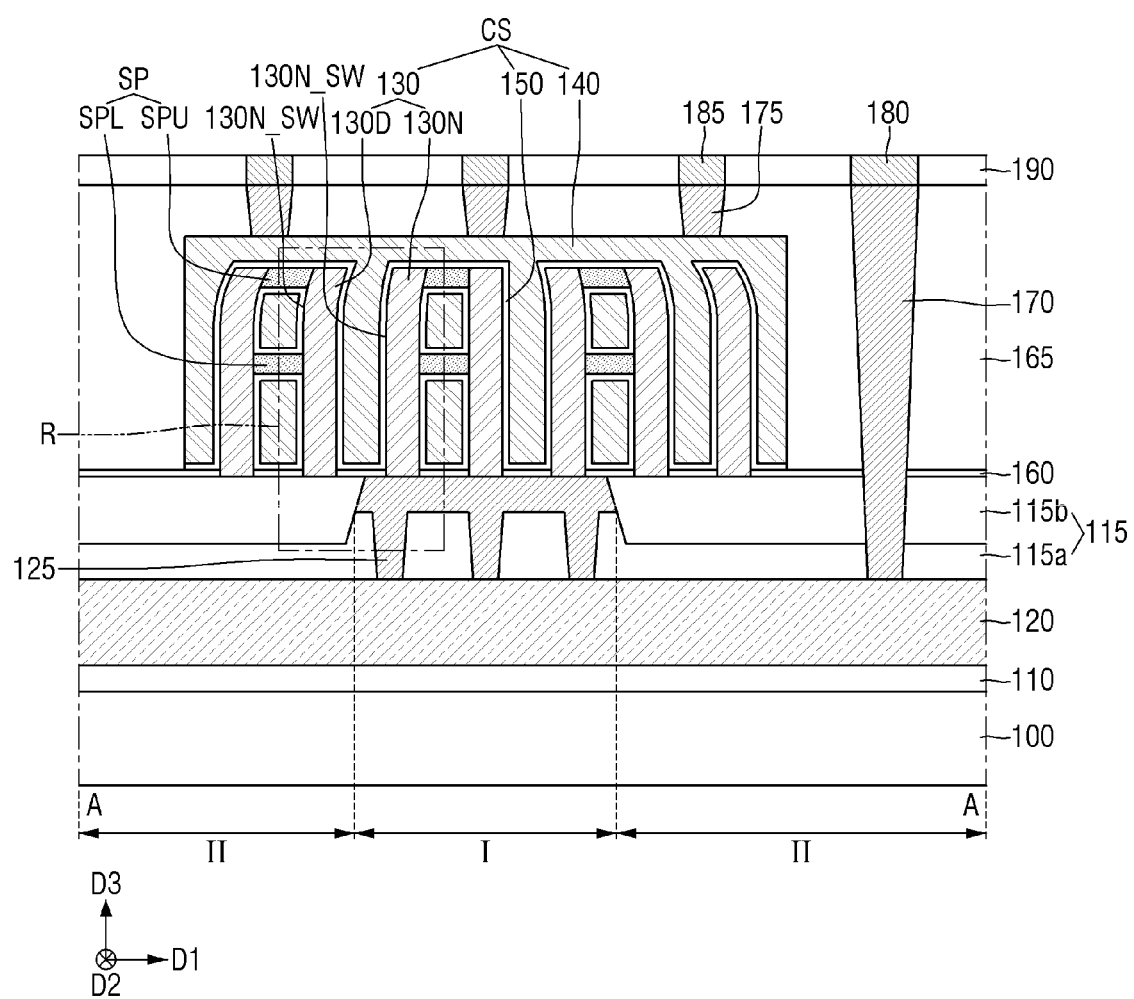
FIG. 6 is an example cross-sectional view illustrating a semiconductor device according to some embodiments.
Figure 7:
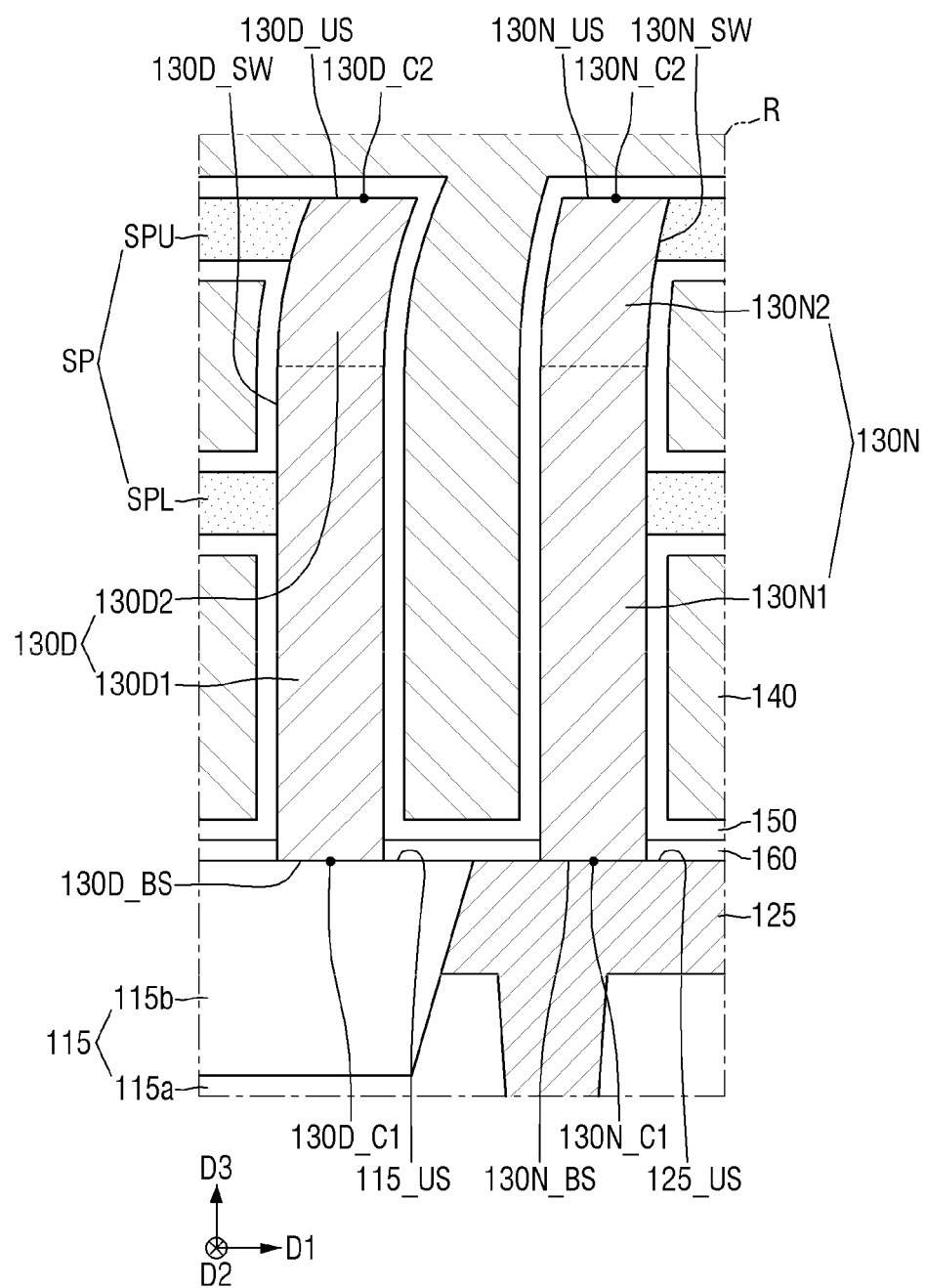
FIG. 7 is an enlarged view illustrating a region R of FIG. 6.

FIG. 6 is an example cross-sectional view illustrating a semiconductor device according to some embodiments. FIG. 7 is an enlarged view illustrating a region R of FIG. 6. For convenience of description, the following description will be based on a difference from that made with reference to FIGS. 1 to 3.

Referring to FIGS. 6 and 7, a portion of the normal storage electrode 130N may have a structure that is bent.

The normal storage electrode 130N nearest to the dummy storage electrode 130D may have a structure that is bent. The normal storage electrode 130N disposed at the center may have a structure that is not bent.

In FIG. 7, the center 130N_C1 of the third surface 130N_BS of the normal storage electrode 130N and the center 130N_C2 of the fourth surface 130N_US of the normal storage electrode 130N are misaligned. That is, the center 130N_C1 of the third surface 130N_BS and the center 130N_C2 of the fourth surface 130N_US do not overlap each other in the third direction D3. A virtual straight line for connecting the center 130N_C1 of the third surface 130N_BS with the center 130N_C2 of the fourth surface 130N_US is not extended in the third direction D3. The virtual straight line for connecting the center 130N_C1 of the third surface 130N_BS with the center 130N_C2 of the fourth surface 130N_US may extend in a random direction different from the third direction D3.

The normal storage electrode 130N nearest to the dummy storage electrode 130D includes the first portion 130N1 and the second portion 130N2. The slope of the first portion 130N1 of the normal storage electrode 130N and the slope of the second portion 130N2 of the normal storage electrode 130N may be different from each other. The first portion 130N1 of the normal storage electrode 130N may extend in the third direction D3, and the second portion 130N2 of the normal storage electrode 130N may extend in a random direction different from the third direction D3.

Figure 8:
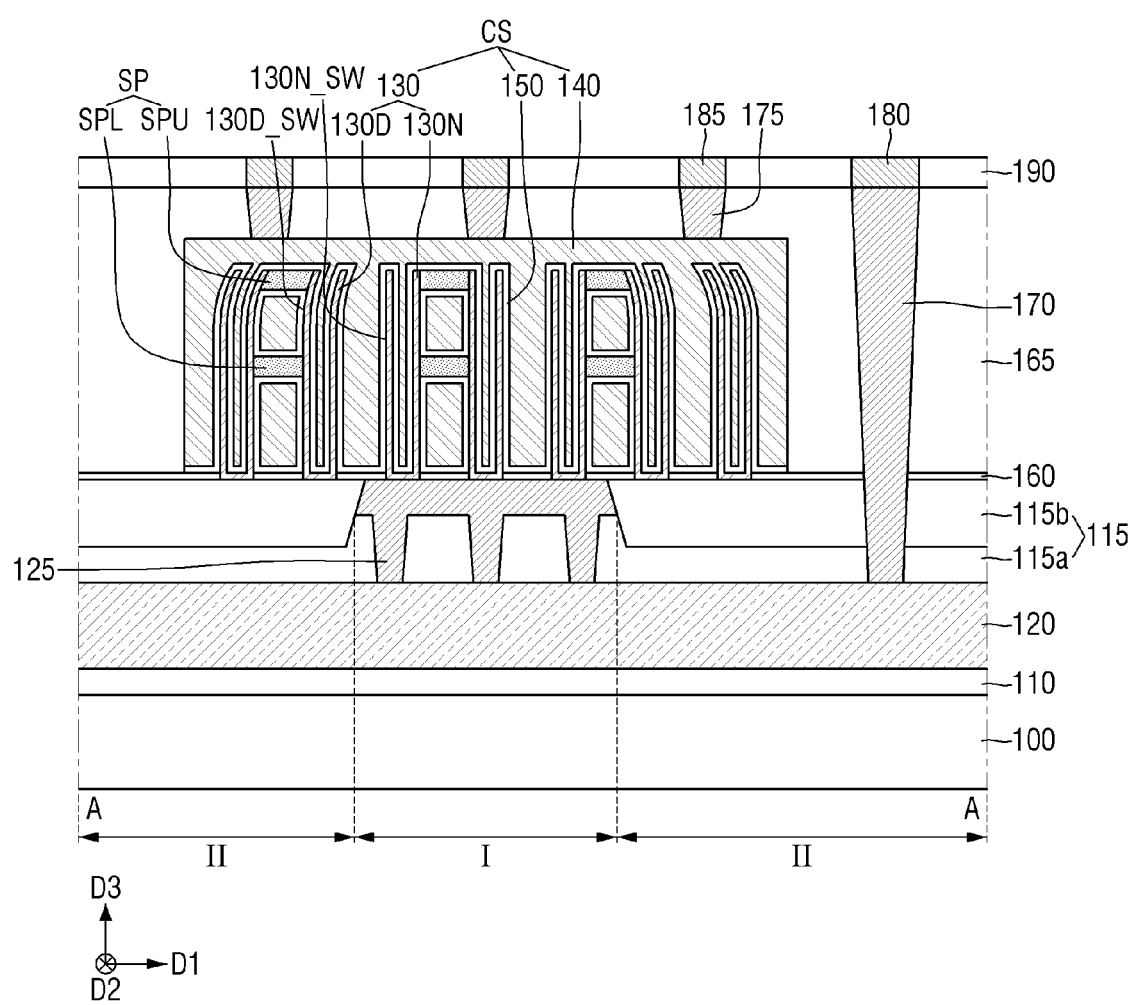
FIG. 8 is an example cross-sectional view illustrating a semiconductor device according to some embodiments.

FIG. 8 is an example cross-sectional view illustrating a semiconductor device according to some embodiments.

Referring to FIG. 8, the storage electrode 130 may have a cylindrical shape. Each storage electrode 130 may be in the form of a cup. For example, each of the dummy storage electrode 130D and the normal storage electrode 130N may have an open top and a closed bottom.

Figure 9:
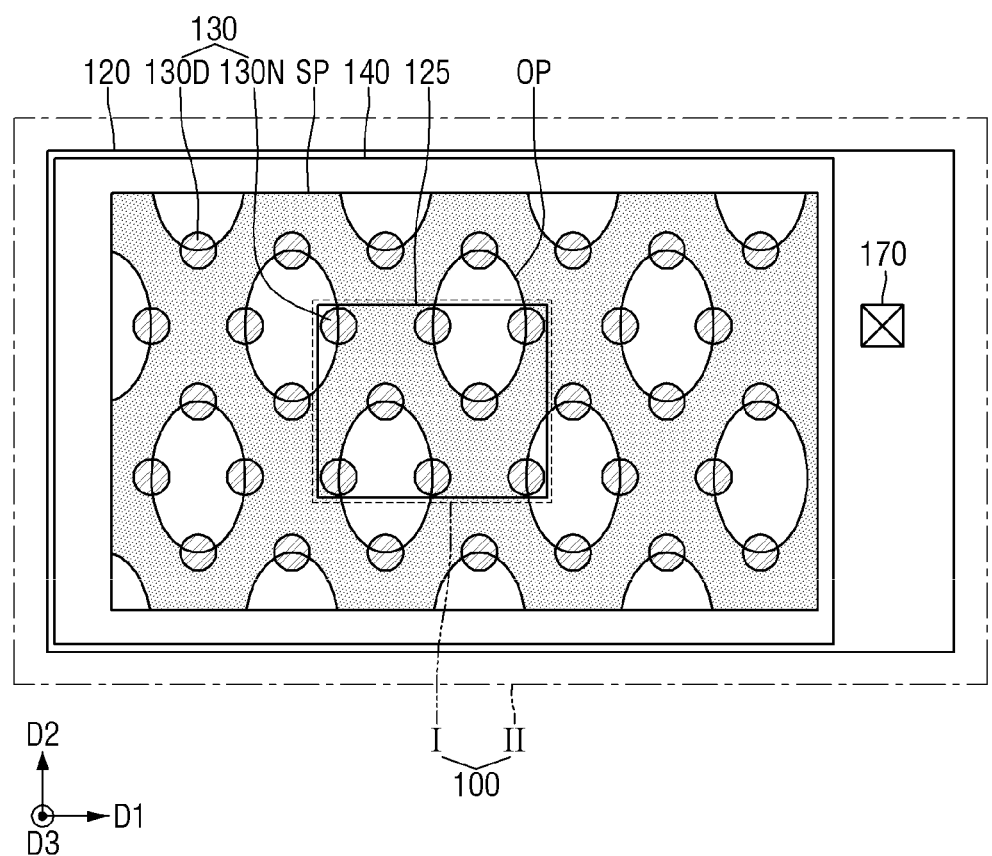
FIGS. 9, 10, and 11 are example plan views illustrating a semiconductor device according to some embodiments.
Figure 10:
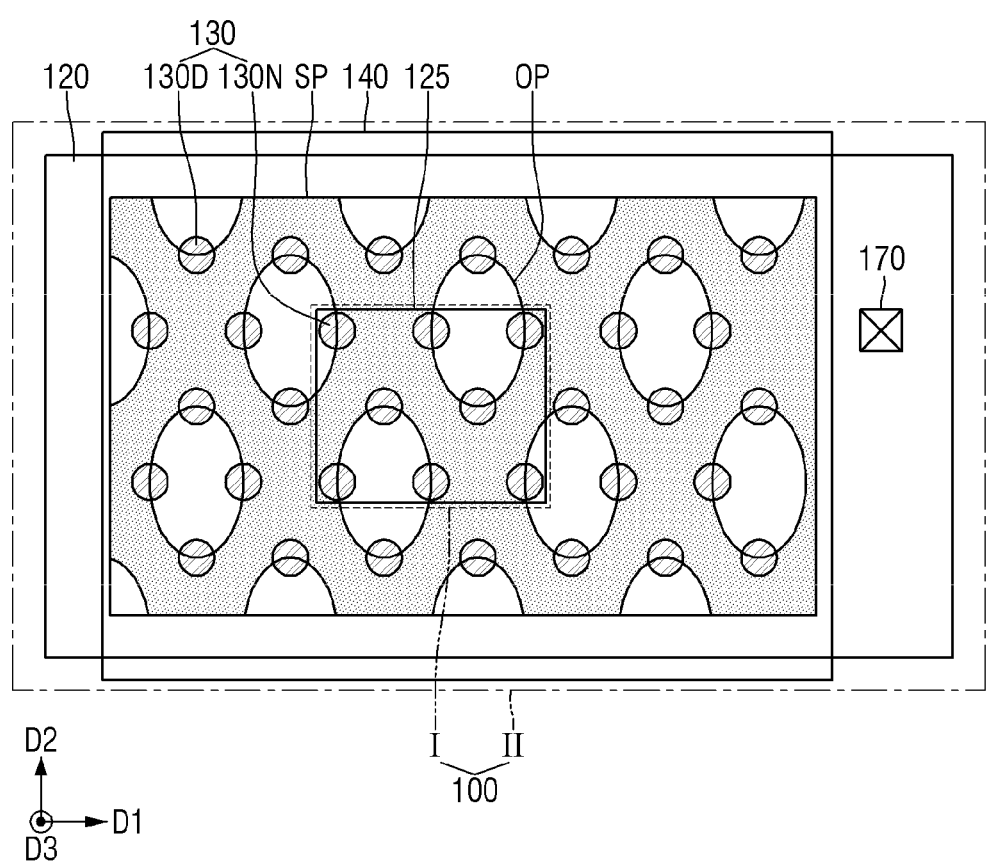
Figure 11:
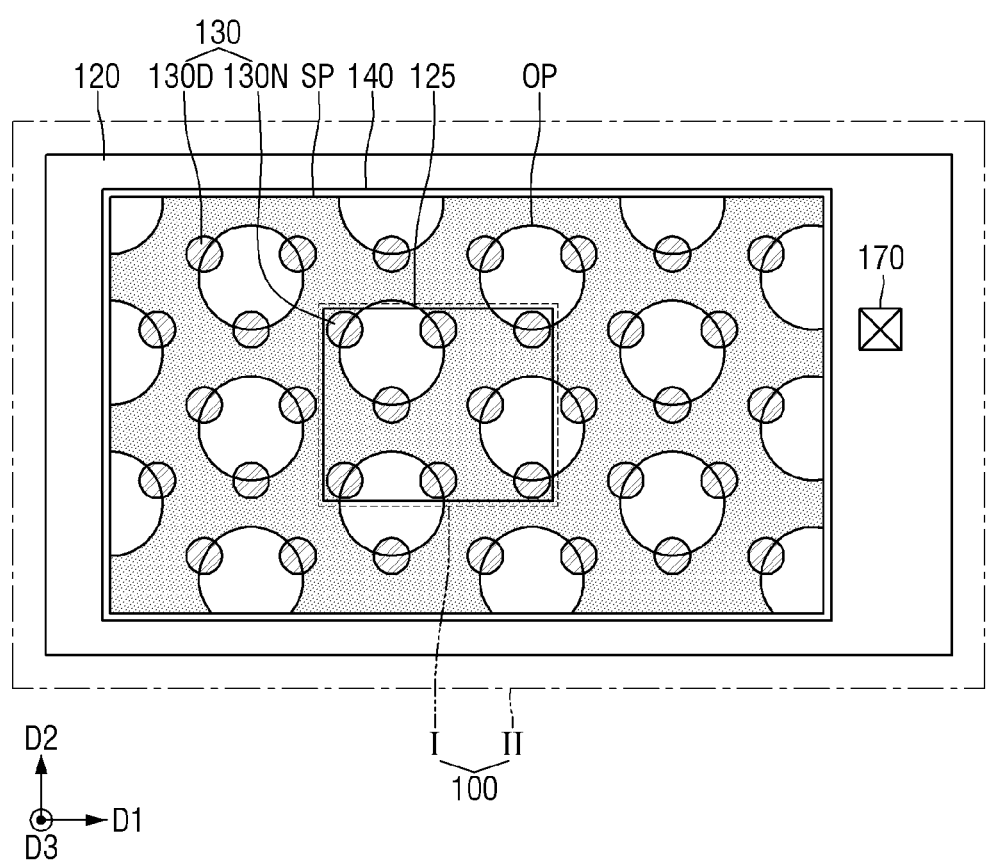

FIGS. 9 to 11 are example plan views illustrating a semiconductor device according to some embodiments. For convenience of description, the following description will be based on a difference from that made with reference to FIG. 1.

Referring to FIG. 9, a width of the common electrode 120 in the second direction D2 and a width of the upper electrode 140 in the second direction D2 may substantially be the same as each other.

Even in this case, a width of the common electrode 120 in the first direction D1 is greater than that of the upper electrode 140 in the first direction D1. That is, the common electrode 120 may have a portion that is not overlapped with the upper electrode 140 in the third direction D3. The first contact 170 may be disposed on the common electrode 120 that is not overlapped with the upper electrode 140 in the third direction D3.

Referring to FIG. 10, the width of the common electrode 120 in the second direction D2 is smaller than that of the upper electrode 140 in the second direction D2. That is, the upper electrode 140 may include a portion that is not overlapped with the common electrode 120 in the third direction D3.

Even in this case, the width of the common electrode 120 in the first direction D1 is greater than that of the upper electrode 140 in the first direction D1.

Referring to FIG. 11, a closed curve of the opening OP may pass through the center of three storage electrodes 130 adjacent to one another.

Figure 12:
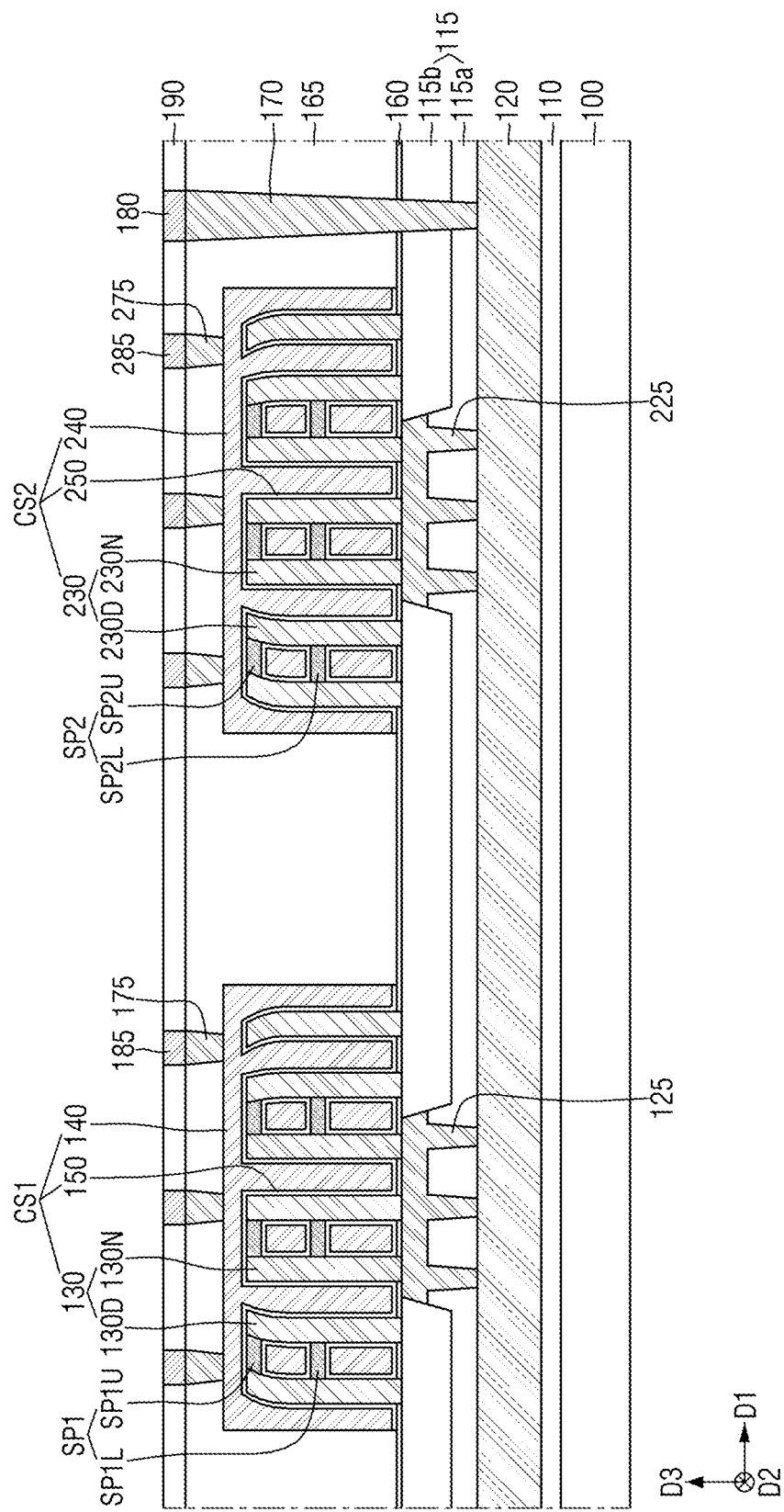
FIGS. 12 and 13 are example cross-sectional views illustrating a semiconductor device according to some embodiments.
Figure 13:
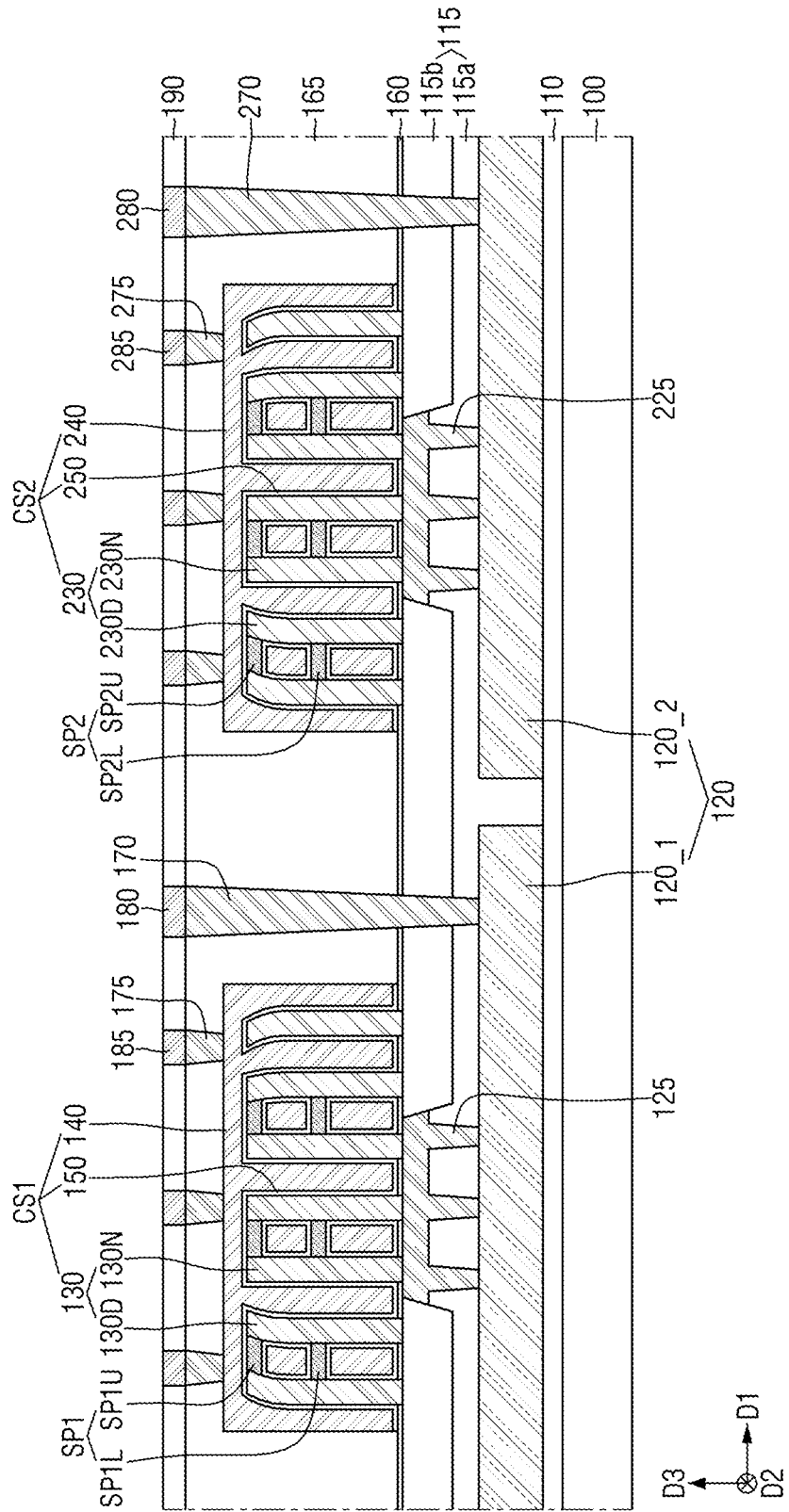

FIGS. 12 and 13 are example cross-sectional views illustrating a semiconductor device according to some embodiments.

Referring to FIG. 12, the lower electrode includes a first lower electrode 125 and a second lower electrode 225. The first lower electrode 125 and the second lower electrode 225 may be spaced apart from each other in the first direction D1. The second interlayer insulating layer 115 may be disposed between the first lower electrode 125 and the second lower electrode 225.

The common electrode 120 may extend along or to be long in the first direction D1. The first lower electrode 125 and the second lower electrode 225 may be connected with the common electrode 120.

The capacitor structure includes a first capacitor structure CS1 and a second capacitor structure CS2. The first capacitor structure CS1 and the second capacitor structure CS2 may be spaced apart from each other in the first direction D1. The first capacitor structure CS1 may be disposed on the first lower electrode 125. The second capacitor structure CS2 may be disposed on the second lower electrode 225.

The first capacitor structure CS1 includes a first storage electrode 130, a first upper electrode 140, and a first capacitor dielectric layer 150. The second capacitor structure CS2 includes a second storage electrode 230, a second upper electrode 240, and a second capacitor dielectric layer 250.

The first storage electrode 130 includes a first dummy storage electrode 130D and a first normal storage electrode 130N. The first dummy storage electrode 130D is not electrically connected with the first lower electrode 125. The first dummy storage electrode 130D is connected with the second interlayer insulating layer 115. The first dummy storage electrode 130D may be electrically floated. The first normal storage electrode 130N is electrically connected with the first lower electrode 125. The first normal storage electrodes 130N may electrically be connected with one another in parallel.

A first support layer SP1 may structurally support the plurality of first storage electrodes 130. The first support layer SP1 may include a first lower support layer SP1L and a first upper support layer SP1U. The first lower support layer SP1L and the first upper support layer SP1U may be spaced apart from each other in the third direction D3.

The second storage electrode 230 includes a second dummy storage electrode 230D and a second normal storage electrode 230N. The second dummy storage electrode 230D is not electrically connected with the second lower electrode 225. The second dummy storage electrode 230D is connected with the second interlayer insulating layer 115. The second dummy storage electrode 230D may be electrically floated. The second normal storage electrode 230N is electrically connected with the second lower electrode 225. The second normal storage electrodes 230N may electrically be connected with one another in parallel.

A second support layer SP2 may structurally support the plurality of second storage electrodes 230. The second support layer SP2 may include a second lower support layer SP2L and a second upper support layer SP2U. The second lower support layer SP2L and the second upper support layer SP2U may be spaced apart from each other in the third direction D3.

In some embodiments, the first normal storage electrode 130N and the second normal storage electrode 230N are all electrically connected with the common electrode 120. Therefore, the plurality of first normal storage electrodes 130N and the plurality of second normal storage electrodes 230N are electrically connected with each other in parallel.

The semiconductor device according to some embodiments may further include a third contact 275 electrically connected with the second upper electrode 240 and a third wiring pattern 285 electrically connected with the third contact 275, on the second capacitor structure CS2.

The third contact 275 includes a conductive material. The third contact 275 is electrically connected with the second upper electrode 240. The third contact 275 may include at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), or combinations thereof.

The third wiring pattern 285 may be disposed in the fourth interlayer insulating layer 190. The third wiring pattern 285 may include at least one of, for example, tungsten (W), copper (Cu) or aluminum (Al), but is not limited thereto.

Referring to FIG. 13, the common electrode 120 includes a first common electrode 120_1 and a second common electrode 120_2.

The first common electrode 120_1 and the second common electrode 120_2 may be spaced apart from each other in the first direction D1. An insulating material may be disposed between the first common electrode 120_1 and the second common electrode 120_2. The second interlayer insulating layer 115 may be disposed between the first common electrode 120_1 and the second common electrode 120_2.

The first lower electrode 125 is disposed on the first common electrode 120_1. The first capacitor structure CS1 is disposed on the first lower electrode 125. A second lower electrode 225 is disposed on the second common electrode 120_2. The second capacitor structure CS2 is disposed on the second lower electrode 225.

The first common electrode 120_1 and the second common electrode 120_2 are not electrically connected with each other. Therefore, the plurality of first normal storage electrodes 130N of the first capacitor structure CS1 may electrically be connected with the plurality of second normal storage electrodes 230N of the second capacitor structure CS2 in series. The first contact 170 may electrically be connected with the first common electrode 120_1. The first contact 170 may not be electrically connected with the second common electrode 120_2.

The semiconductor device according to some embodiments may further include a fourth contact 270 electrically connected with the second common electrode 120_2, and a fourth wiring pattern 280 electrically connected with the fourth contact 270.

The fourth contact 270 includes a conductive material. The fourth contact 270 is electrically connected with the second common electrode 120_2. The fourth contact 270 may include at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), or combinations thereof.

The fourth wiring pattern 280 may be disposed in the fourth interlayer insulating layer 190. The fourth wiring pattern 280 may include at least one of, for example, tungsten (W), copper (Cu) or aluminum (Al), but is not limited thereto.

Figure 14:
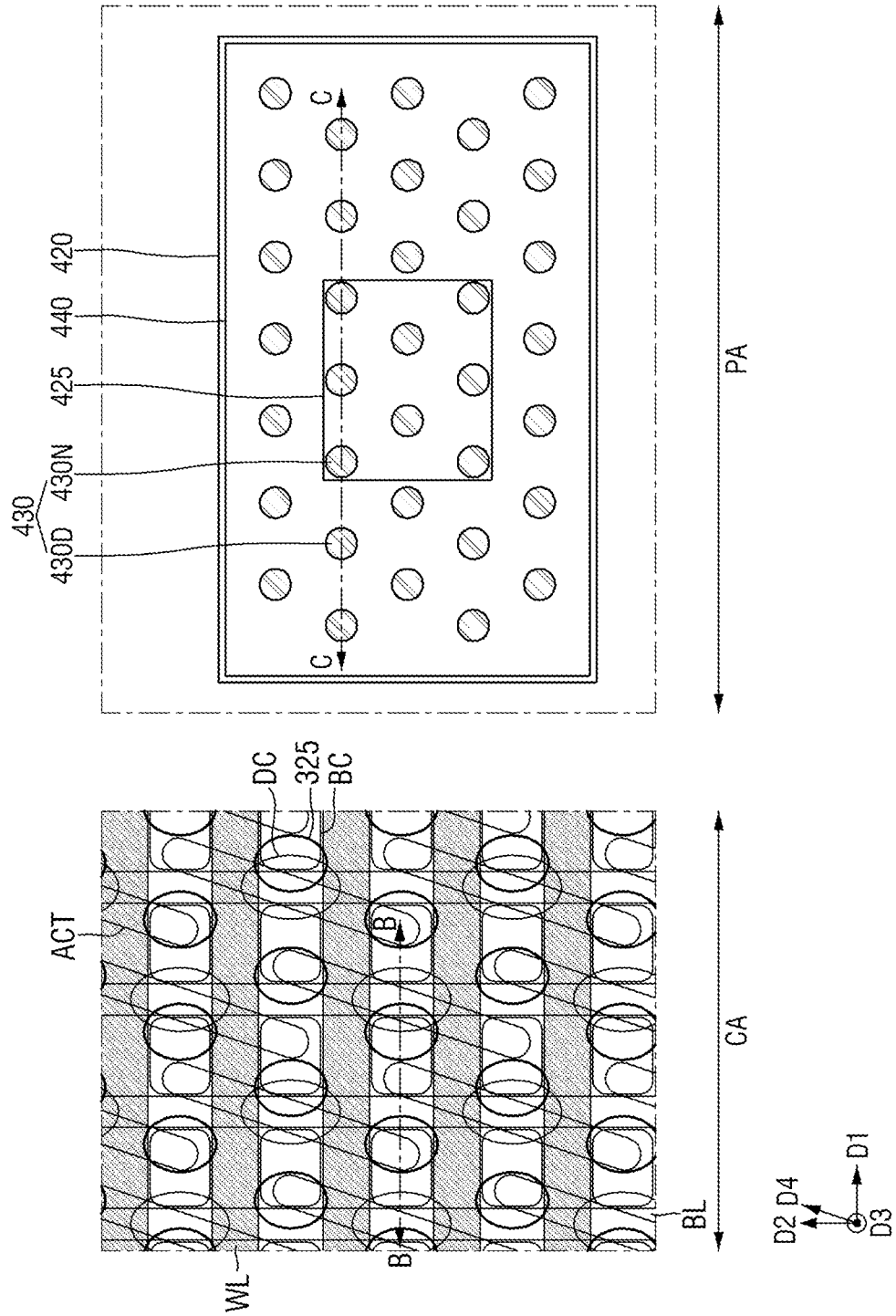
FIG. 14 is a plan view illustrating a semiconductor device according to some embodiments.
Figure 15:
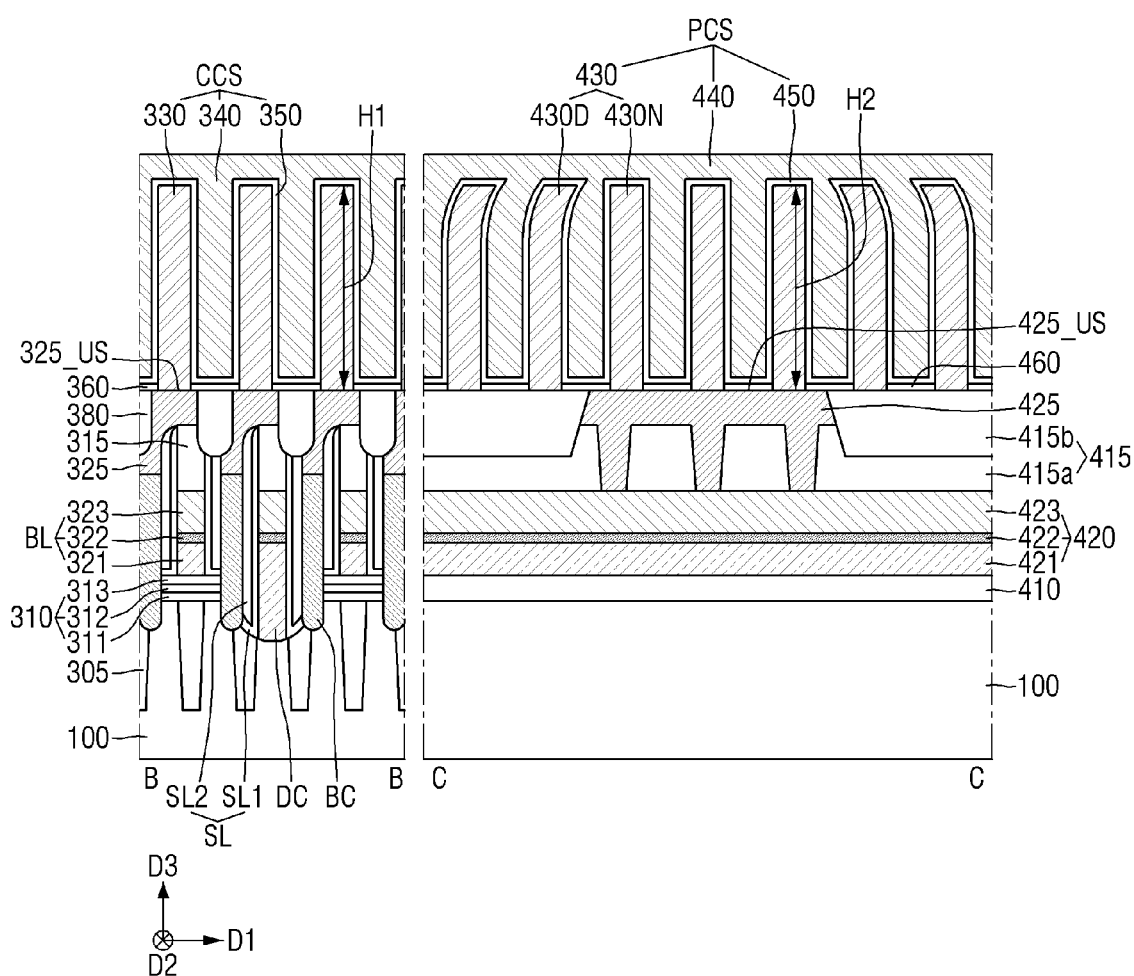
FIG. 15 is a cross-sectional view taken along lines B-B and C-C of FIG. 14.

FIG. 14 is a plan view illustrating a semiconductor device according to some embodiments. FIG. 15 is a cross-sectional view taken along lines B-B and C-C of FIG. 14. Hereinafter, the semiconductor device according to some embodiments will be described with reference to FIGS. 14 and 15. Hereinafter, the semiconductor device may be, for example, a DRAM.

Referring to FIGS. 14 and 15, the substrate 100 includes a cell array region CA and a peripheral region PA.

The peripheral region PA may be disposed near the cell array region CA. Peripheral circuits for driving word lines WL and bit lines BL, which are disposed in the cell array region CA, may be disposed in the peripheral region PA.

A cell device isolation layer 305 may be disposed in the substrate 100 of the cell array region CA. The cell device isolation layer 305 may define a cell active region ACT. As a design rule of the semiconductor device is reduced, as shown, the cell active region ACT may be disposed in the form of a diagonal line or oblique line. For example, the cell active region ACT may extend in a fourth direction D4. The fourth direction D4 may be a random direction between or non-orthogonal to the first direction D1 and the second direction D2.

The cell active regions ACT may be arranged in parallel with each other in the first direction D1. An end of one cell active region ACT may be arranged to be adjacent to the center of another adjacent cell active region ACT.

The semiconductor device according to some embodiments may include various contact arrangements formed on the cell active region ACT. Various contact arrangements may include, for example, a direct contact DC, a buried contact BC, and a landing pad 325.

In this case, the direct contact DC may mean a contact for electrically connecting the cell active region ACT to the bit line BL. The buried contact BC may mean a contact for connecting the cell active region ACT to a cell storage electrode 330. In view of a layout structure, a contact area of the buried contact BC and the cell active region ACT may be small. Therefore, the conductive landing pad 325 may be introduced to enlarge the contact area with the cell storage electrode 330 together with enlarging the contact area with the cell active region ACT.

The landing pad 325 may be disposed between the cell active region ACT and the buried contact BC, or may be disposed between the buried contact BC and the cell storage electrode 330. In the semiconductor device according to some embodiments, the landing pad 325 may be disposed between the buried contact BC and the cell storage electrode 330. As the contact area is enlarged through the introduction of the landing pad 325, contact resistance between the cell active region ACT and the cell storage electrode 330 may be reduced.

The word lines WL may be buried in the substrate 100. The word lines WL may cross the cell active region ACT. The word lines WL may extend in the first direction D1. The word lines WL may be spaced apart from each other in the second direction D2. The word lines WL may be buried in the substrate 100 and may extend in the first direction D1. Although not shown, a doped region may be formed in the cell active region ACT between the word lines WL. N-type impurities may be doped in the doped region.

A buffer layer 310 may be disposed on the substrate 100 of the cell array region CA. The buffer layer 310 may include a first cell insulating layer 311, a second cell insulating layer 312 and a third cell insulating layer 313, which are sequentially stacked. The second cell insulating layer 312 may include a material having an etch selectivity with respect to the first cell insulating layer 311 and the third cell insulating layer 313. For example, the second cell insulating layer 312 may include silicon nitride. The first and third cell insulating layers 311 and 313 may include silicon oxide.

The bit lines BL may be disposed on the buffer layer 310. The bit lines BL may cross the substrate 100 and the word lines WL. As shown in FIG. 14, the bit lines BL may extend in the second direction D2. The bit lines BL may be spaced apart from each other in the first direction D1.

The bit lines BL may include a bit line lower electrode 321, a bit line middle electrode 322 and a bit line upper electrode 323, which are sequentially stacked. The bit line lower electrode 321 may include polysilicon doped with impurities. The bit line middle electrode 322 may include TiSiN. The bit line upper electrode 323 may include tungsten (W). However, embodiments of the present disclosure are not limited to these examples.

A bit line capping pattern 315 may be disposed on the bit line BL. The bit line capping pattern 315 is shown as a single layer, but is not limited thereto. The bit line capping pattern 315 may be a multi-layer. The bit line capping pattern 315 may include silicon nitride.

A bit line spacer SL may be disposed on a sidewall of the bit line BL and a sidewall of the bit line capping pattern 315. The bit line spacer SL may be disposed on the substrate 100 and the cell device isolation layer 305 in a bit line BL portion where a direct contact DC is formed. However, in a portion where the direct contact DC is not formed, the bit line spacer SL may be disposed on the buffer layer 310.

Although the bit line spacer SL may be a single layer, as shown the bit line spacer SL may be a multi-layer that includes first and second bit line spacers SL1 and SL2. For example, the first and second bit line spacers SL1 and SL2 may include one of a silicon oxide layer, a silicon nitride layer, a silicon oxynitride (SiON) layer, a silicon oxycarbonitride (SiOCN) layer, air and combinations thereof, but are not limited thereto.

The buffer layer 310 may be interposed between the bit line BL and the cell device isolation layer 305 and between the bit line spacer SL and the substrate 100.

The bit line BL may electrically be connected with the doped region of the cell active region ACT by the direct contact DC. The direct contact DC may be formed of polysilicon doped with impurities, for example.

The buried contact BC may be disposed between a pair of adjacent bit lines BL. The buried contacts BC may be spaced apart from each other. The buried contact BC may include at least one of polysilicon doped with impurities, a conductive silicide compound, a conductive metal nitride, or a metal. The buried contacts BC may have island shapes spaced apart from each other on the plane or in plan view. The buried contact BC may be in contact with the doped regions of the cell active region ACT by passing through the buffer layer 310.

On the buried contact BC, the landing pad 325 may be formed. The landing pad 325 may electrically be connected with the buried contact BC. The landing pad 325 may overlap a portion of an upper surface of the bit line BL. The landing pad 325 may include at least one of tungsten, a semiconductor material doped with impurities, a conductive silicide compound, a conductive metal nitride, a conductive metal carbide, a metal, or a metal alloy.

A pad isolation insulating layer 380 may be formed on the landing pad 325 and the bit line BL. For example, the pad isolation insulating layer 380 may be disposed on the bit line capping pattern 315. The pad isolation insulating layer 380 may define a region of the landing pad 325, which forms a plurality of isolation regions. In addition, the pad isolation insulating layer 380 may not cover an upper surface of the landing pad 325.

The pad isolation insulating layer 380 may include an insulating material to electrically isolate the plurality of landing pads 325 from each other. For example, the pad isolation insulating layer 380 may include at least one of a silicon oxide layer, a silicon nitride layer, a silicon oxynitride layer, a silicon oxycarbonitride layer, or a silicon carbonitride layer.

The cell etch stop layer 360 may be disposed on the pad isolation insulating layer 380 and the landing pad 325. The cell etch stop layer 360 may include at least one of a silicon nitride layer, a silicon carbonitride layer, a silicon boron nitride (SiBN) layer, a silicon oxynitride layer, or a silicon oxycarbide layer.

A cell capacitor structure CCS may be disposed on the landing pad 325. The cell capacitor structure CCS may electrically be connected with the landing pad 325. A portion of the cell capacitor structure CCS may be disposed in the cell etch stop layer 360. The cell capacitor structure CCS includes a cell storage electrode 330, a cell upper electrode 340, and a cell capacitor dielectric layer 350.

The cell storage electrode 330 may be disposed on the landing pad 325. The cell storage electrode 330 is shown as having a pillar shape, but is not limited thereto. The cell storage electrode 330 may have a cylindrical shape. The cell capacitor dielectric layer 350 is formed on the cell storage electrode 330. The cell capacitor dielectric layer 350 may be formed along a profile of the cell storage electrode 330. The cell upper electrode 340 is formed on the cell capacitor dielectric layer 350. The cell upper electrode 340 may surround an outer wall of the cell storage electrode 330.

As an example, the cell capacitor dielectric layer 350 may be disposed in a portion overlapped with the cell upper electrode 340 in the third direction D3. As another example, unlike the shown example, the cell capacitor dielectric layer 350 may include a first portion overlapped with the cell upper electrode 340 in the third direction D3 and a second portion that is not vertically overlapped with the cell upper electrode 340. That is, the second portion of the cell capacitor dielectric layer 350 may not be covered by the cell upper electrode 340.

Each of the cell storage electrode 330 and the cell upper electrode 340 may include, for example, a doped semiconductor material, a conductive metal nitride (e.g., titanium nitride, tantalum nitride, niobium nitride or tungsten nitride), a metal (e.g., ruthenium, iridium, titanium or tantalum), and a conductive metal oxide (e.g., iridium oxide or niobium oxide), but is not limited thereto.

The cell capacitor dielectric layer 350 may include one of, for example, silicon oxide, silicon nitride, silicon oxynitride, a high dielectric constant material, and combinations thereof, but is not limited thereto. In the semiconductor device according to some embodiments, the cell capacitor dielectric layer 350 may include a stacked layer structure in which zirconium oxide, aluminum oxide and zirconium oxide are sequentially stacked. In the semiconductor device according to some embodiments, the cell capacitor dielectric layer 350 may include a dielectric layer containing hafnium (Hf). In the semiconductor device according to some embodiments, the cell capacitor dielectric layer 350 may have a stacked layer structure of a ferroelectric material layer and a paraelectric material layer.

A first peripheral interlayer insulating layer 410, a peripheral common electrode 420, a second peripheral interlayer insulating layer 415, a peripheral lower electrode 425, a peripheral etch stop layer 460 and a peripheral capacitor structure PCS may be formed on the substrate 100 of the peripheral region PA.

Since the first peripheral interlayer insulating layer 410 may substantially be the same as the first interlayer insulating layer 110 shown in FIGS. 1 to 3, its description will be omitted.

The peripheral common electrode 420 may be disposed on the first peripheral interlayer insulating layer 410. The peripheral common electrode 420 may be formed at the same level as the bit line BL. The term "formed at the same level" means that corresponding elements are formed by the same manufacturing process. That is, the stacked structure of the peripheral common electrode 420 may be the same as that of the bit line BL.

For example, the peripheral common electrode 420 may include a first electrode 421, a second electrode 422, and a third electrode 423. The first electrode 421, the second electrode 422 and the third electrode 423 may sequentially be stacked in the third direction D3. The first electrode 421 may be formed at the same level as the bit line lower electrode 321. The second electrode 422 may be formed at the same level as the bit line middle electrode 322. The third electrode 423 may be formed at the same level as the bit line upper electrode 323.

A height of the first electrode 421 in the third direction D3 is the same as that of the bit line lower electrode 321 in the third direction D3. A height of the second electrode 422 in the third direction D3 is the same as that of the bit line middle electrode 322 in the third direction D3. A height of the third electrode 423 in the third direction D3 is the same as that of the bit line upper electrode 323 in the third direction D3.

The first electrode 421 may include polysilicon doped with impurities. The second electrode 422 may include TiSiN. The third electrode 423 may include tungsten (W). However, embodiments of the present disclosure are not limited to these examples.

The second peripheral interlayer insulating layer 415 may be disposed on the peripheral common electrode 420. The second peripheral interlayer insulating layer 415 may be a multi-layer that includes a second peripheral lower insulating layer 415a and a second peripheral upper insulating layer 415b. In some embodiments, the second peripheral lower insulating layer 415a may be formed at the same level as the bit line capping pattern 315, and the second peripheral upper insulating layer 415b may be formed at the same level as the pad isolation insulating layer 380, but embodiments of the present disclosure are not limited thereto.

The second peripheral lower insulating layer 415a may be a silicon nitride layer. The second peripheral upper insulating layer 415b may include at least one of a silicon oxide layer, a silicon nitride layer, a silicon oxynitride layer, a silicon oxycarbonitride layer, or a silicon carbonitride layer.

The peripheral lower electrode 425 may be formed on the peripheral common electrode 420. The peripheral lower electrode 425 may be disposed in the second peripheral interlayer insulating layer 415. The peripheral lower electrode 425 may be disposed between the substrate 100 and the peripheral capacitor structure PCS. The peripheral lower electrode 425 may substantially be the same as the lower electrode 125 described with reference to FIGS. 1 to 3. The peripheral lower electrode 425 may be formed at the same level as the landing pad 325. That is, an upper surface 425_US of the peripheral lower electrode 425 may be coplanar with an upper surface 325_US of the landing pad 325. The peripheral lower electrode 425 may include a conductive material. The peripheral lower electrode 425 may include at least one of, for example, tungsten, a semiconductor material doped with impurities, a conductive silicide compound, a conductive metal nitride, a conductive metal carbide, a metal, or a metal alloy.

The etch stop layer 460 may be formed at the same level as the cell etch stop layer 360. The peripheral etch stop layer 460 may be formed on the second peripheral interlayer insulating layer 415 and the peripheral lower electrode 425. The material included in the peripheral etch stop layer 460 may be the same as that included in the cell etch stop layer 360.

The peripheral capacitor structure PCS may be disposed on the peripheral lower electrode 425. The peripheral capacitor structure PCS may be connected with the peripheral lower electrode 425. The peripheral capacitor structure PCS includes a peripheral storage electrode 430, a peripheral upper electrode 440, and a peripheral capacitor dielectric layer 450.

The peripheral storage electrode 430 includes a peripheral dummy storage electrode 430D and a peripheral normal storage electrode 430N. The peripheral normal storage electrode 430N is disposed in a center or central region of the peripheral capacitor structure PCS. The peripheral normal storage electrode 430N is overlapped with the peripheral lower electrode 425 in the third direction D3. The peripheral dummy storage electrode 430D is disposed in an edge region of the peripheral capacitor structure PCS. The peripheral dummy storage electrode 430D is not overlapped with the peripheral lower electrode 425 in the third direction D3.

The peripheral normal storage electrode 430N is connected with the peripheral lower electrode 425. The peripheral normal storage electrode 430N may be electrically connected with the peripheral lower electrode 425. The peripheral dummy storage electrode 430D is not electrically connected with the peripheral lower electrode 425. The peripheral dummy storage electrode 430D is directly connected with the second peripheral interlayer insulating layer 415. The peripheral dummy storage electrode 430D may be electrically floated.

The peripheral dummy storage electrode 430D may have a structure that is bent. An upper portion of the peripheral dummy storage electrode 430D may be tilted toward the peripheral normal storage electrode 430N. For example, in FIG. 15, the peripheral dummy storage electrode 430D to the left of the peripheral normal storage electrode 430N may be tilted towards the right, that is, toward the peripheral normal storage electrode 430N. In contrast, the peripheral dummy storage electrode 430D to the right of the peripheral normal storage electrode 430N may be tilted towards the left, that is, toward the peripheral normal storage electrode 430N.

The peripheral upper electrode 440 may be disposed on the peripheral storage electrode 430. The peripheral capacitor dielectric layer 450 may be disposed between the peripheral upper electrode 440 and the peripheral storage electrode 430. The cell capacitor structure CCS and the peripheral capacitor structure PCS may be formed at the same level. Therefore, a height H1 of the cell storage electrode 330 in the third direction D3 may be the same as a height H2 of the peripheral storage electrode 430 in the third direction D3.

A material included in the peripheral storage electrode 430 and the peripheral upper electrode 440 is the same as that included in the cell storage electrode 330 and the cell upper electrode 340, respectively. A material included in the peripheral capacitor dielectric layer 450 is the same as that included in the cell capacitor dielectric layer 350.

Figure 16:
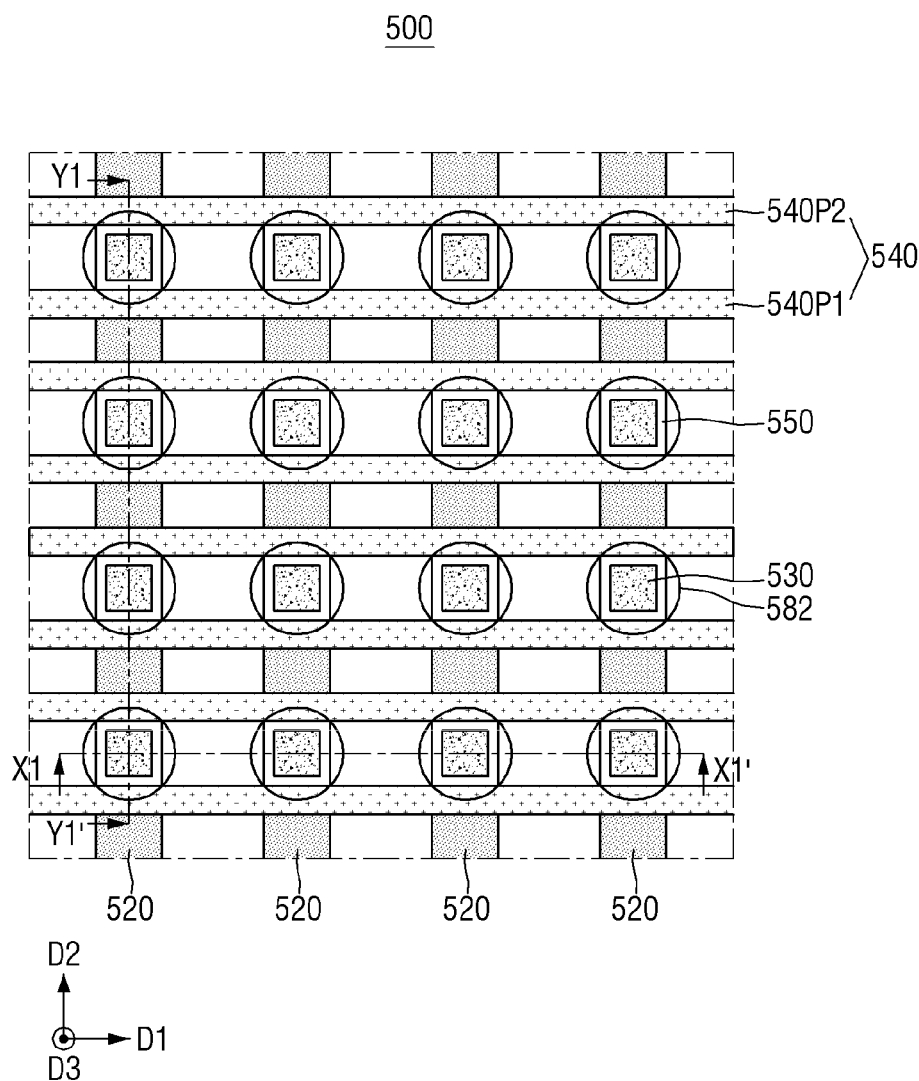
FIG. 16 is a layout view illustrating a semiconductor device according to some embodiments.
Figure 17:
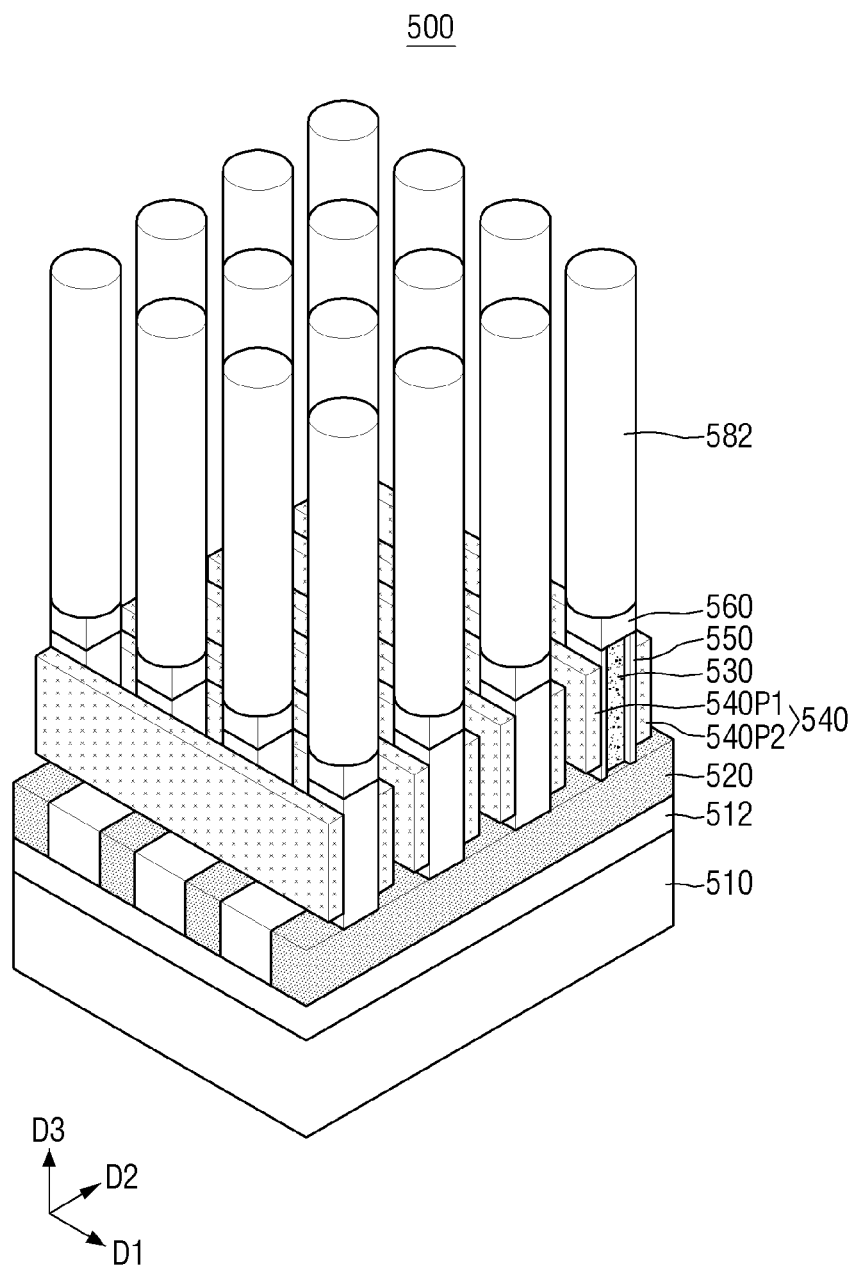
FIG. 17 is a perspective view illustrating a semiconductor device according to some embodiments.
Figure 18:
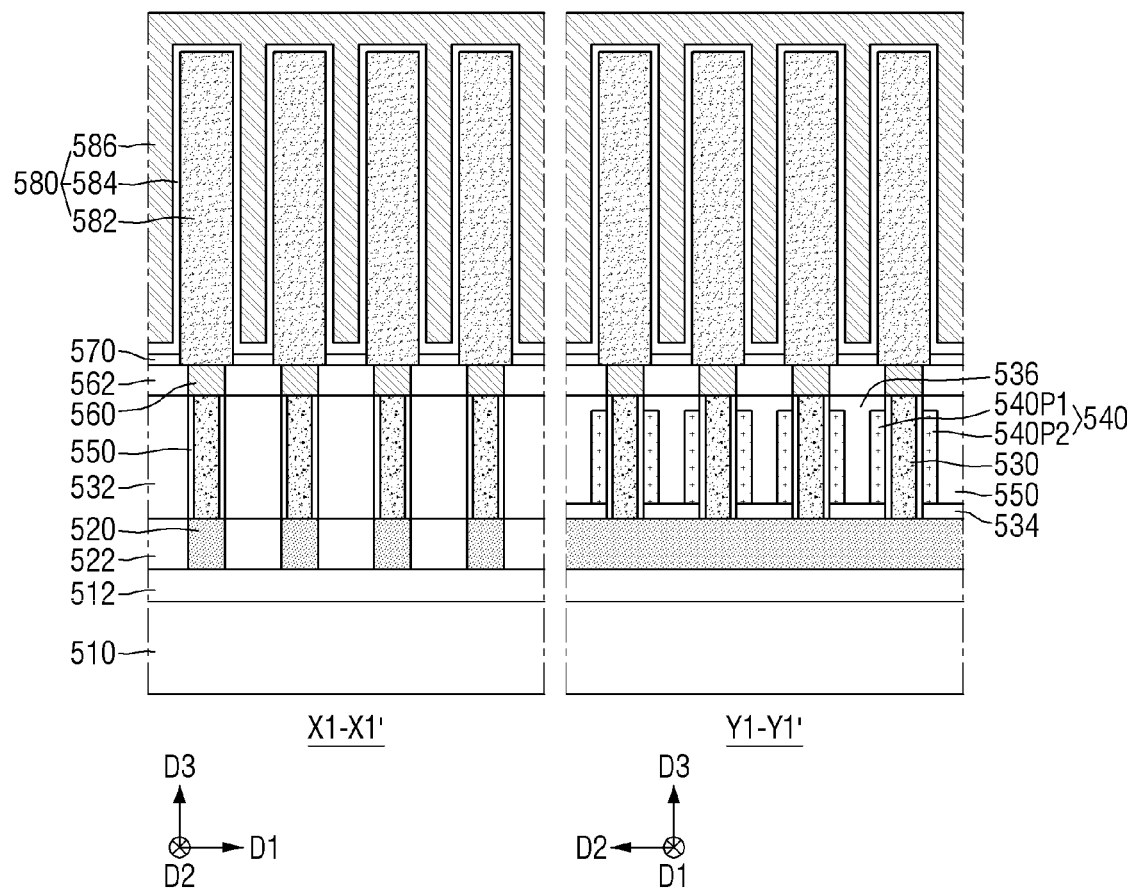
FIG. 18 is a cross-sectional view taken along lines X1-X1' and Y1-Y1' of FIG. 16.

FIG. 16 is a layout view illustrating a semiconductor device according to some embodiments. FIG. 17 is a perspective view illustrating a semiconductor device according to some embodiments. FIG. 18 is a cross-sectional view taken along lines X1-X1' and Y1-Y1' of FIG. 16.

Referring to FIGS. 16 to 18, the semiconductor device 500 may include a substrate 510, a plurality of first conductive lines 520, a channel layer 530, a gate electrode 540, a gate insulating layer 550, and a capacitor structure 580. The semiconductor device 500 may be a memory device that includes a vertical channel transistor (VCT). The vertical channel transistor may indicate a structure in which a channel length of the channel layer 530 is extended from the substrate 510 along a vertical direction (e.g., D3). The capacitor structure 580 of FIGS. 16 to 18 may be the same as the capacitor structure CS described with reference to FIGS. 1 to 3.

A lower insulating layer 512 may be disposed on the substrate 510, and the plurality of first conductive lines 520 may be spaced apart from each other in the first direction D1 and may extend in the second direction D2 on the lower insulating layer 512. A plurality of first insulating patterns 522 may be disposed on the lower insulating layer 512 to fill a space between the plurality of first conductive lines 520. The plurality of first insulating patterns 522 may extend in the second direction D2, and an upper surface of the plurality of first insulating patterns 522 may be disposed at the same level as that of the plurality of first conductive lines 520. The plurality of first conductive lines 520 may serve as bit lines of the semiconductor device 500.

In some embodiments, the plurality of first conductive lines 520 may include doped polysilicon, metal, conductive metal nitride, conductive metal silicide, conductive metal oxide or combinations thereof. For example, the plurality of first conductive lines 520 may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or combinations thereof. The plurality of first conductive lines 520 may include a single layer or multi-layer of the materials described above. In some embodiments, the plurality of first conductive lines 520 may include a two-dimensional semiconductor material, and the two-dimensional semiconductor material may include, for example, graphene, a carbon nanotube or combinations thereof.

The channel layer 530 may be arranged in a matrix shape spaced apart from another channel layer in the first direction D1 and the second direction D2 on the plurality of first conductive lines 520. The channel layer 530 may have a first width according to the first direction D1 and a first height according to the third direction D3, wherein the first height may be greater than the first width. For example, the first height may be about 2 times to 10 times of the first width, but is not limited thereto. A bottom portion of the channel layer 530 may serve as a first source/drain region (not shown), an upper portion of the channel layer 530 may serve as a second source/drain region (not shown), and a portion of the channel layer 530 between the first and second source/drain regions may serve as a channel region (not shown).

In some embodiments, the channel layer 530 may include an oxide semiconductor, and the oxide semiconductor may include, for example, $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_x$-$In_yZn_zO$, $Ga_xZn_ySn_zO$, $Al_xZn_ySn_zO$, $Yb_xGa_yZn_zO$, $In_xGa_yO$ or combinations thereof. The channel layer 530 may include a single layer or multi-layer of the oxide semiconductor. In some embodiments, the channel layer 530 may have a bandgap energy that is greater than that of silicon. For example, the channel layer 530 may have a bandgap energy of about 1.5 eV to 5.6 eV. For example, the channel layer 530 may have improved or optimal channel performance when the channel layer 530 has a bandgap energy of about 2.0 eV to 4.0 eV. For example, the channel layer 530 may be polycrystalline or amorphous, but is not limited thereto. In some embodiments, the channel layer 530 may include a two-dimensional semiconductor material, and the two-dimensional semiconductor material may include, for example, graphene, a carbon nanotube or combinations thereof.

The gate electrode 540 may extend from both sidewalls of the channel layer 530 in the first direction D1. The gate electrode 540 may include a first sub-gate electrode 540P1 facing a first sidewall of the channel layer 530 and a second sub-gate electrode 540P2 facing a second sidewall opposite to the first sidewall of the channel layer 530. As one channel layer 530 is disposed between the first sub-gate electrode 540P1 and the second sub-gate electrode 540P2, the semiconductor device 500 may have a dual gate transistor structure, but embodiments of the present disclosure are not limited thereto. The second sub-gate electrode 540P2 may be omitted, and only the first sub-gate electrode 540P1 facing the first sidewall of the channel layer 530 may be formed so that a single gate transistor structure may be implemented.

The gate electrode 540 may include doped polysilicon, metal, conductive metal nitride, conductive metal silicide, conductive metal oxide or combinations thereof. For example, the gate electrode 540 may include, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof.

The gate insulating layer 550 surrounds the sidewall of the channel layer 530, and may be interposed between the channel layer 530 and the gate electrode 540. For example, as shown in FIG. 16, the entire sidewall of the channel layer 530 may be surrounded by the gate insulating layer 550, and a portion of the sidewall of the gate electrode 540 may be in contact with the gate insulating layer 550. In other embodiments, the gate insulating layer 550 may extend in the extension direction (i.e., first direction D1) of the gate electrode 540, and only two sidewalls, which face the gate electrode 540, among the sidewalls of the channel layer 530 may be in contact with the gate insulating layer 550.

In some embodiments, the gate insulating layer 550 may be made of a silicon oxide layer, a silicon oxynitride layer, a high dielectric layer having a dielectric constant higher than that of the silicon oxide layer, or combinations thereof. The high dielectric layer may be made of a metal oxide or a metal oxynitride. For example, the high dielectric layer capable of being used as the gate insulating layer 550 may be made of $HfO_2$, HfSiO, HfSiON, HfTaO, HfSiO, HfZrO, $ZrO_2$, $Al_2O_3$ or combinations thereof, but is not limited thereto.

A plurality of second insulating patterns 532 may extend along the second direction D2 on the plurality of first insulating patterns 522, and the channel layer 530 may be disposed between two adjacent second insulating patterns 532 among the plurality of second insulating patterns 532. Also, a first buried layer 534 and a second buried layer 536 may be disposed in a space between two adjacent channel layers 530 between the two adjacent second insulating patterns 532. The first buried layer 534 may be disposed on a bottom portion of the space between the two adjacent channel layers 530, and the second buried layer 536 may be formed to fill the remainder of the space between the two adjacent channel layers 530 on the first buried layer 534. An upper surface of the second buried layer 536 may be disposed at the same level as that of the channel layer 530, and the second buried layer 536 may cover an upper surface of the gate electrode 540. Alternatively, the plurality of second insulating patterns 532 may be formed of a material layer continuous with the plurality of first insulating patterns 522, or the second buried layer 536 may be formed of a material layer continuous with the first buried layer 534.

A capacitor contact 560 may be disposed on the channel layer 530. The capacitor contact 560 may be disposed to be vertically overlapped with the channel layer 530, and may be arranged in a matrix shape spaced apart from another capacitor contact in the first direction D1 and the second direction D2. The capacitor contact 560 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof, but is not limited thereto. An upper insulating layer 562 may surround a sidewall of the capacitor contact 560 on the plurality of second insulating patterns 532 and the second buried layer 536.

An etch stop layer 570 may be disposed on the upper insulating layer 562, and a capacitor structure 580 may be disposed on the etch stop layer 570. The capacitor structure 580 may include a storage electrode 582, a capacitor dielectric layer 584, and an upper electrode 586.

The storage electrode 582 may electrically be connected with an upper surface of the capacitor contact 560 through the etch stop layer 570. The storage electrode 582 may be formed of a pillar type extended in the third direction D3, but is not limited thereto. In some embodiments, the storage electrode 582 may be disposed to be vertically overlapped with the capacitor contact 560, and may be arranged in a matrix shape spaced apart from another storage electrode in the first direction D1 and the second direction D2. Alternatively, a landing pad (not shown) may be further disposed between the capacitor contact 560 and the storage electrode 582 so that the storage electrode 582 may be arranged in a hexagonal shape.

Figure 19:
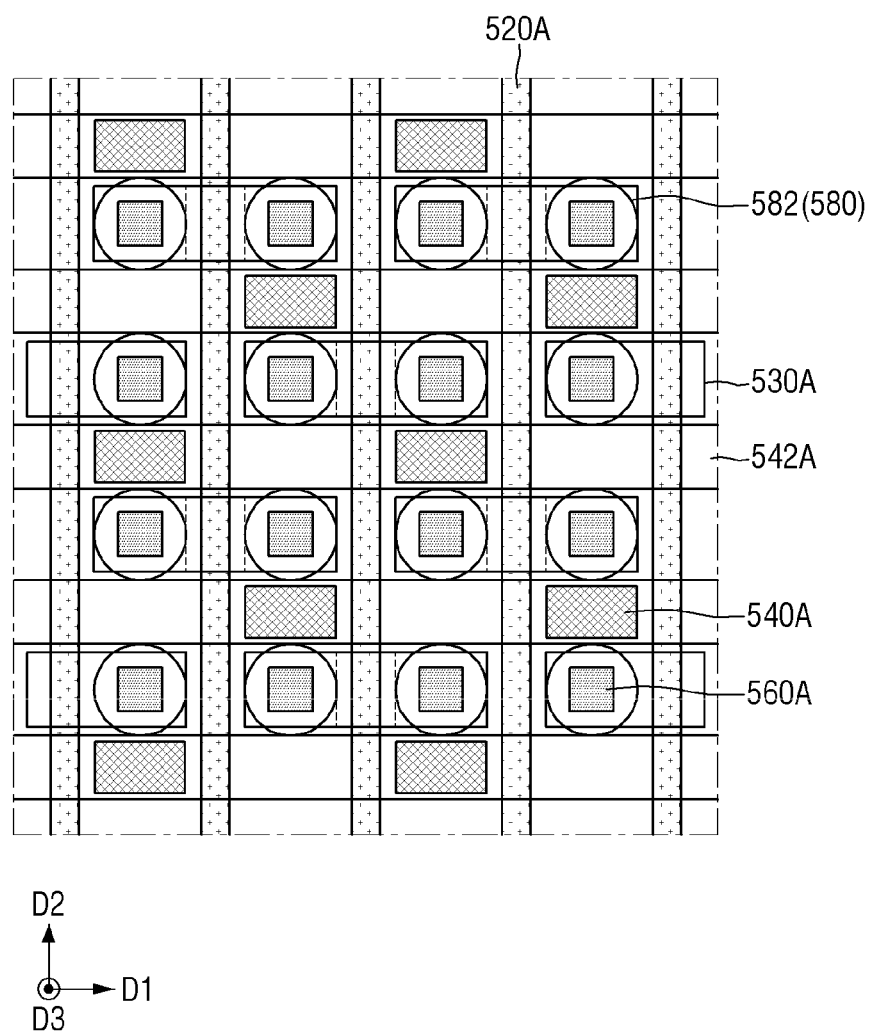
FIG. 19 is a layout view illustrating a semiconductor device according to some embodiments.
Figure 20:
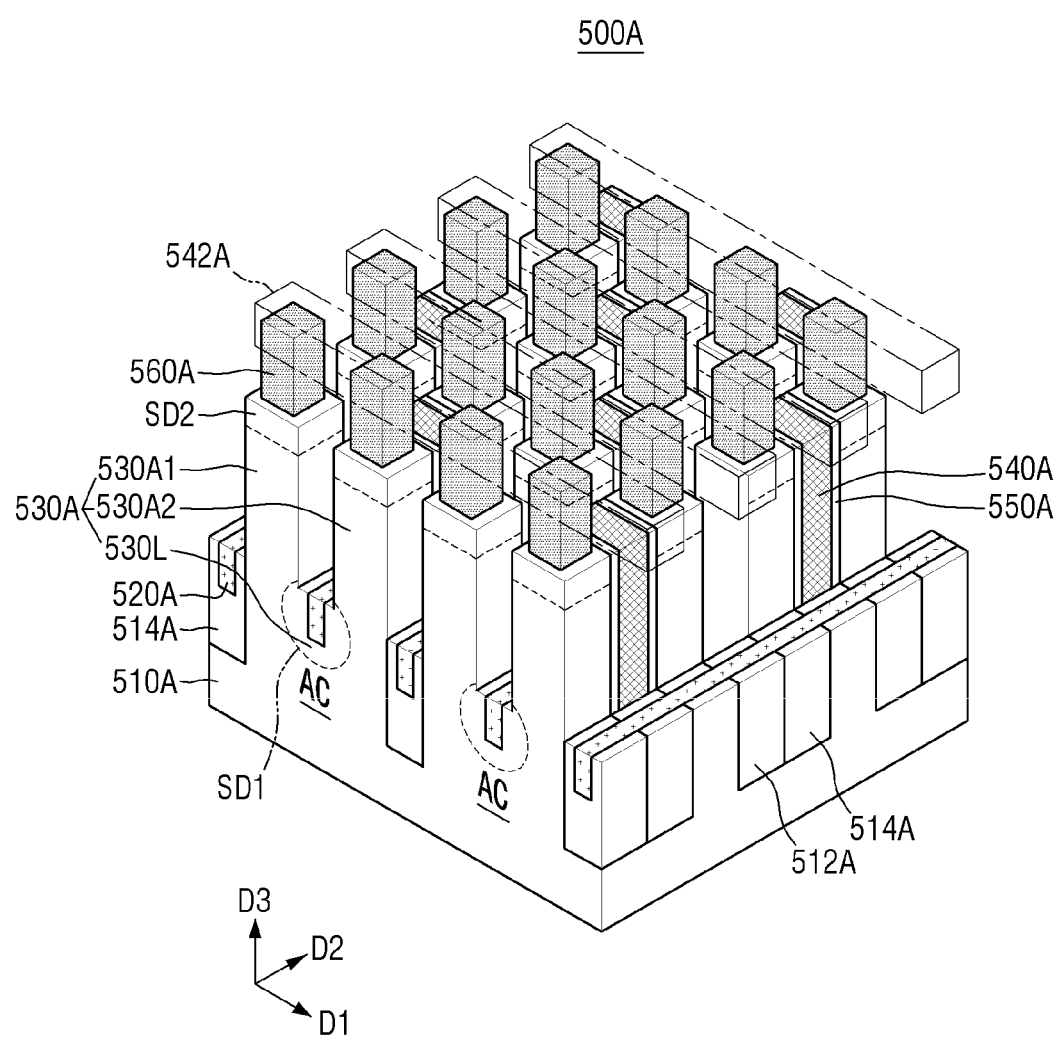
FIG. 20 is a perspective view illustrating a semiconductor device according to some embodiments.

FIG. 19 is a layout view illustrating a semiconductor device according to some embodiments. FIG. 20 is a perspective view illustrating a semiconductor device according to some embodiments.

Referring to FIGS. 19 and 20, a semiconductor device 500A may include a substrate 510A, a plurality of first conductive lines 520A, a channel structure 530A, a contact gate electrode 540A, a plurality of second conductive lines 542A, and a capacitor structure 580. The semiconductor device 500A may be a memory device that includes a vertical channel transistor (VCT).

A plurality of active regions AC may be defined by a first device isolation layer 512A and a second device isolation layer 514A in the substrate 510A. The channel structure 530A may be disposed in each active region AC, and may include a first active pillar 530A1 and a second active pillar 530A2, which are extended in a vertical direction (e.g., D3), respectively, and a connection portion 530L connected with a bottom portion of the first active pillar 530A1 and a bottom portion of the second active pillar 530A2. A first source/drain region SD1 may be disposed in the connection portion 530L, and a second source/drain region SD2 may be disposed above the first and second active pillars 530A1 and 530A2. Each of the first active pillar 530A1 and the second active pillar 530A2 may constitute an independent unit memory cell.

The plurality of first conductive lines 520A may extend in a direction crossing each of the plurality of active regions AC, and may extend in the second direction D2, for example. One of the plurality of first conductive lines 520A may be disposed on the connection portion 530L between the first active pillar 530A1 and the second active pillar 530A2, and may be disposed on the first source/drain region SD1. Another first conductive line 520A adjacent to the above one first conductive line 520A may be disposed between two channel structures 530A. One of the plurality of first conductive lines 520A may serve as a common bit line included in two unit memory cells constituted by the first active pillar 530A1 and the second active pillar 530A2, which are disposed on both sides thereof.

One contact gate electrode 540A may be disposed between two channel structures 530A adjacent to each other in the second direction D2. For example, the contact gate electrode 540A may be disposed between the first active pillar 530A1 included in one channel structure 530A and the second active pillar 530A2 of the channel structure 530A, which is adjacent to the first active pillar 530A1, and one contact gate electrode 540 may be shared by the first active pillar 530A1 and the second active pillar 530A2, which are disposed on both sidewalls thereof. A gate insulating layer 550A may be disposed between the contact gate electrode 540A and the first active pillar 530A1 and between the contact gate electrode 540A and the second active pillar 530A2. The plurality of second conductive lines 542A may extend in the first direction D1 on an upper surface of the contact gate electrode 540A. The plurality of second conductive lines 542A may serve as word lines of the semiconductor device 500A.

A capacitor contact 560A may be disposed on the channel structure 530A. The capacitor contact 560A may be disposed on the second source/drain region SD2, and a capacitor structure 580 (similar to the capacitor structures described above) may be disposed on the capacitor contact 560A.

FIGS. 21 to 33 are views sequentially illustrating a process of manufacturing a semiconductor device having the cross-section of FIG. 15. Hereinafter, a method of manufacturing a semiconductor device according to some embodiments of the present disclosure will be described.

Figure 21:
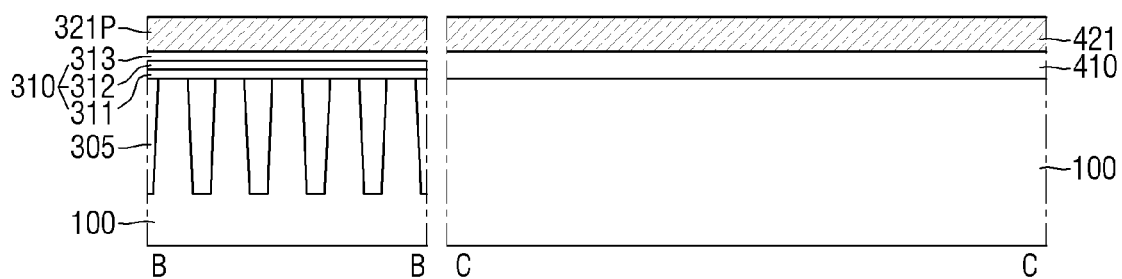
FIGS. 21, 22, 23, 24, 25, 26, 27, 28, 29, 30, 31, 32, and 33 are views sequentially illustrating a process of manufacturing a semiconductor device having the cross-section of FIG. 15.
Figure 21:
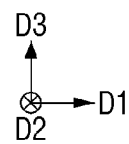

Referring to FIGS. 14 and 21, a substrate 100, which includes a cell array region CA and a peripheral region PA, is provided.

A cell device isolation layer 305 may be formed in the substrate 100 to form a cell active region ACT. The cell device isolation layer 305 may define the cell active region ACT. Although not shown, a peripheral device isolation layer may be formed in the substrate 100 of the peripheral region PA. The peripheral device isolation layer may define a peripheral active region.

Word lines may be formed in in the substrate 100 of the cell array region CA. The word lines WL may be buried in the substrate 100 and may extend in the first direction D1. In the cell array region CA, an ion implantation process may be performed to form a doped region in the cell active region ACT.

Subsequently, a first cell insulating layer 311, a second cell insulating layer 312 and a third cell insulating layer 313 may sequentially be stacked and patterned on the substrate 100 of the cell array region CA, whereby a buffer layer 310 may be formed on the cell array region CA. The first peripheral interlayer insulating layer 410 may be formed on the substrate 100 of the peripheral region PA.

Then, a pre-bit line lower electrode 321P may be formed on the buffer layer 310 of the cell array region CA. A first electrode 421 may be formed on the first peripheral insulating layer 410 of the peripheral region PA. The pre-bit line lower electrode 321P and the first electrode 421 may be formed at the same level. Each of the pre-bit line lower electrode 321P and the first electrode 421 may include polysilicon doped with impurities.

Figure 22:
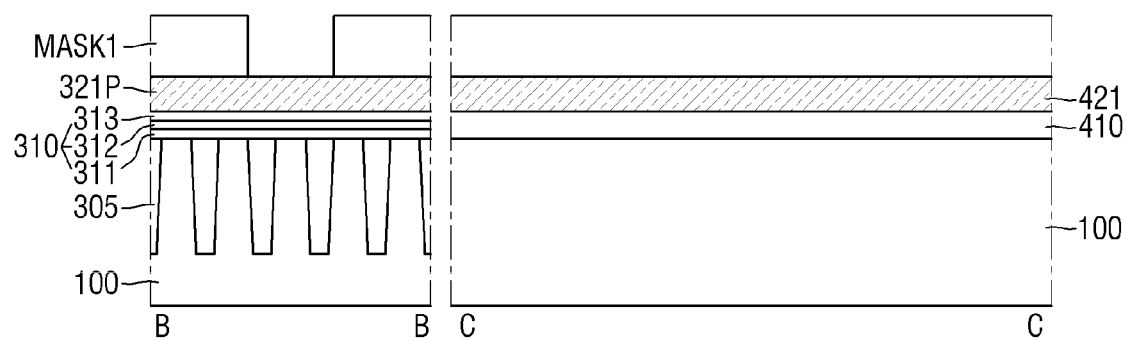
Figure 22:
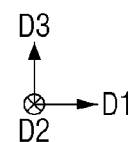

Referring to FIG. 22, in the cell array region CA, a first mask layer MASK1 is formed on the pre-bit line lower electrode 321P. In the peripheral region PA, the first mask layer MASK1 is formed on the first electrode 421.

The first mask layer MASK1 may have an opening that schematically restricts a position of the direct contact DC. The first mask layer MASK1 may be formed of at least one of, for example, a photoresist layer, an amorphous carbon layer (ACL), a spin on hardmask (SOH), a spin on carbon (SOC), or a silicon nitride layer.

Figure 23:
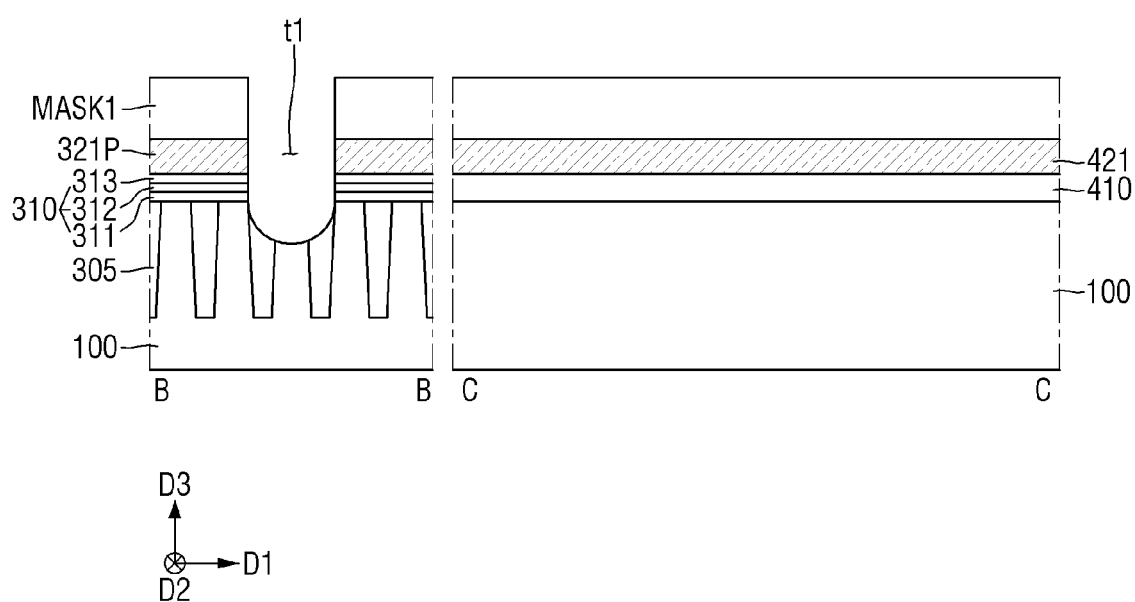

Referring to FIG. 23, a portion of the pre-bit line lower electrode 321P, the buffer layer 310 and the substrate 100 of the cell array region CA may be etched using the first mask layer MASK1 as an etching mask, whereby a first trench t1 may be formed. At this time, an upper portion of the cell device isolation layer 305 may partially be removed.

Figure 24:
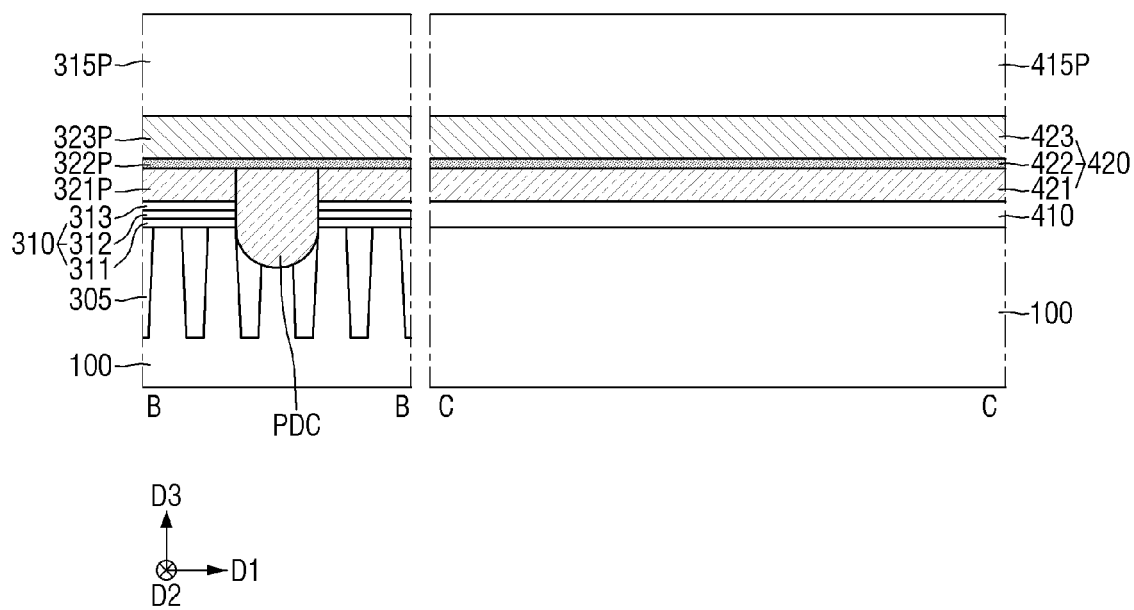

Referring to FIG. 24, the first mask layer MASK1 may be removed to expose an upper portion of the pre-bit line lower electrode 321P and an upper portion of the first electrode 421.

Subsequently, a polysilicon layer doped with impurities may be deposited on an entire surface of the substrate 100 to fill the first trench t1. A CMP process may then be performed to remove the polysilicon layer on the pre-bit line lower electrode 321P, whereby a pre-direct contact PDC may be formed.

Subsequently, a pre-bit line middle electrode 322P, a pre-bit line upper electrode 323P and a pre-bit line capping pattern 315P may sequentially be stacked on the pre-bit line lower electrode 321P and the pre-direct contact PDC. The second electrode 422, the third electrode 423 and a pre-second peripheral lower insulating layer 415P may sequentially be stacked on the first electrode 421.

Each of the pre-bit line middle electrode 322P and the second electrode 422 may be, for example, TiSiN. The pre-bit line upper electrode 323P and the third electrode 423 may be, for example, tungsten. The pre-bit line capping pattern 315P and the pre-second peripheral lower insulating layer 415P may be, for example, silicon nitride.

Figure 25:
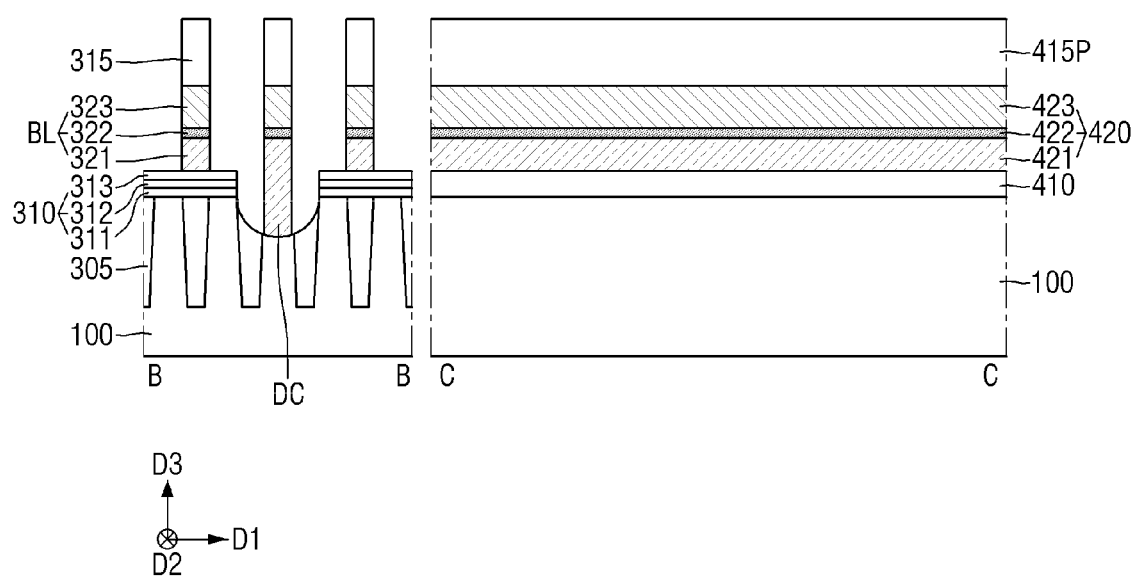

Referring to FIG. 25, the pre-bit line capping pattern 315P, the pre-bit line upper electrode 323P, the pre-bit line middle electrode 322P and the pre-bit line lower electrode 321P of the cell array region CA may be patterned using a mask to form a bit line capping pattern 315 and a bit line BL.

At this time, the pre-direct contact PDC may also be patterned to form a direct contact DC. A portion of a sidewall and a bottom surface of the first trench t1 may be exposed. Since the buffer layer 310 is formed in a triple layer structure that includes first to third cell insulating layers 311, 312 and 313, it may be easier to control the etching process.

Figure 26:
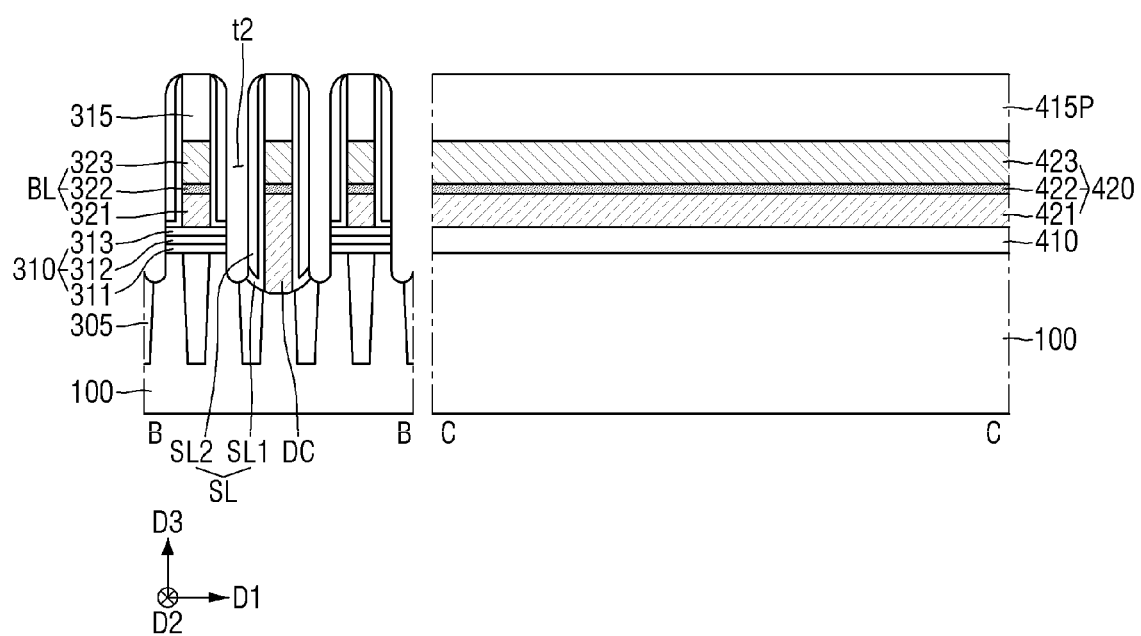

Referring to FIG. 26, bit line spacers SL covering sidewalls of the bit line capping pattern 315 and the bit line BL may be formed. A portion of the buffer layer 310 and the substrate 100 may be removed between the bit line spacers SL, which are adjacent to each other, by using the bit line spacer SL and the bit line capping pattern 315 as etching masks, whereby a second trench t2 may be formed.

Figure 27:
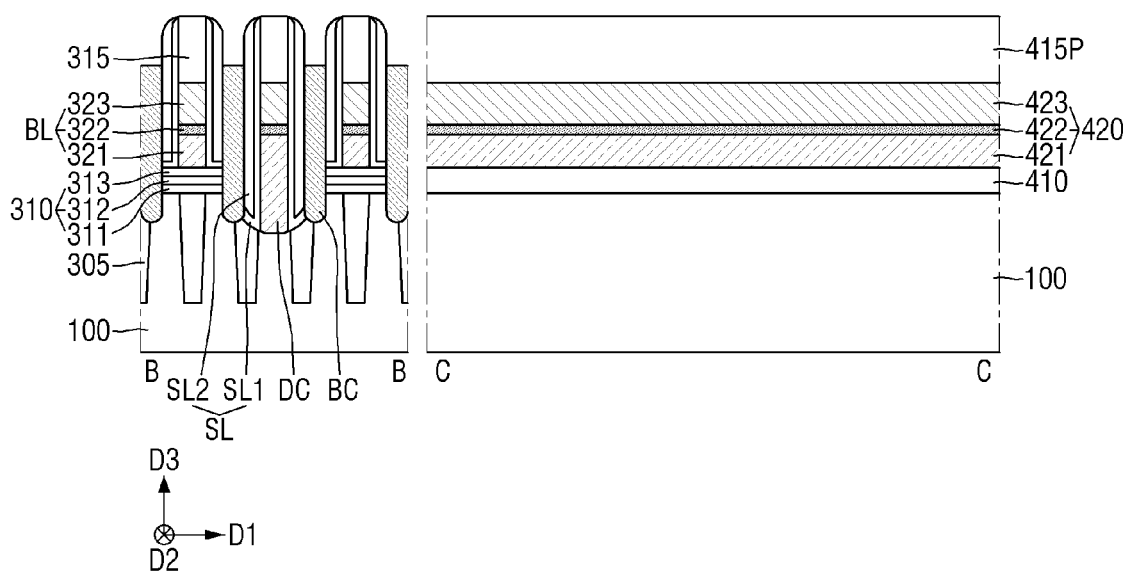

Referring to FIG. 27, a buried contact BC for filling a portion of the second trench t2 may be formed. The buried contact BC may be formed between the bit line spacers SL.

Figure 28:
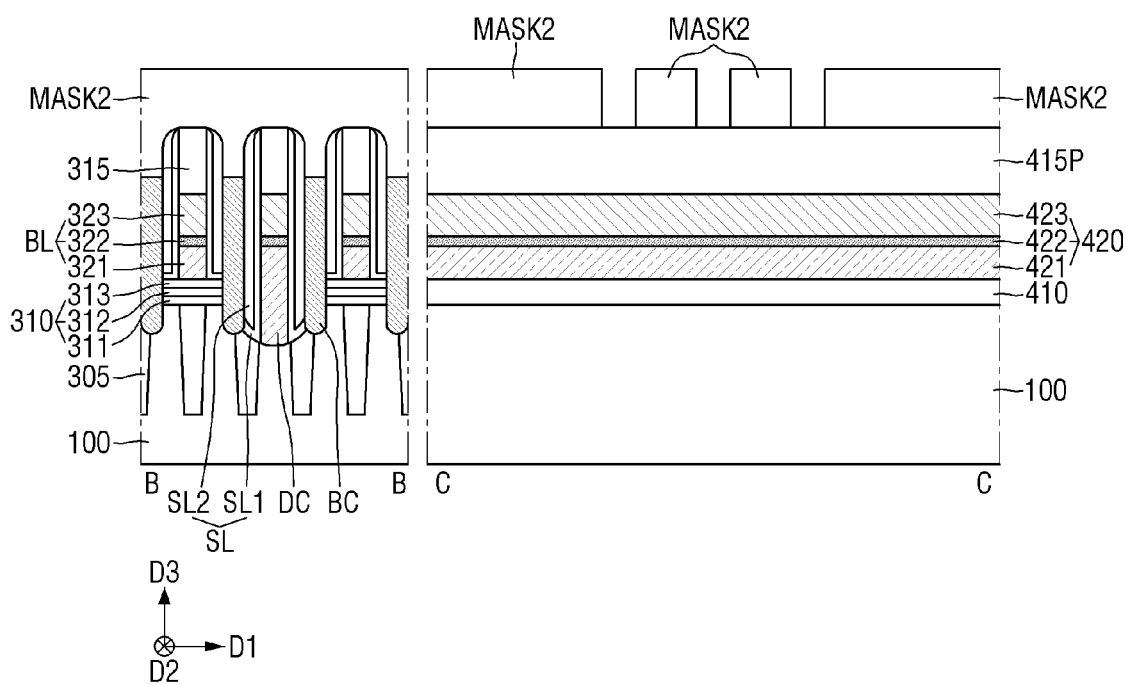

Referring to FIG. 28, a second mask layer MASK2 covering the buried contact BC and the bit line capping pattern 315 may be formed on the substrate 100 of the cell array region CA.

The second mask layer MASK2 is also formed on the substrate 100 of the peripheral region PA. The second mask layer MASK2 may have an opening that schematically restricts a position of a lower electrode 425. The second mask layer MASK2 may be formed of at least one of, for example, a photoresist layer, an amorphous carbon layer (ACL), a spin on hardmask (SOH), a spin on carbon black (SOC) or a silicon nitride layer.

Figure 29:
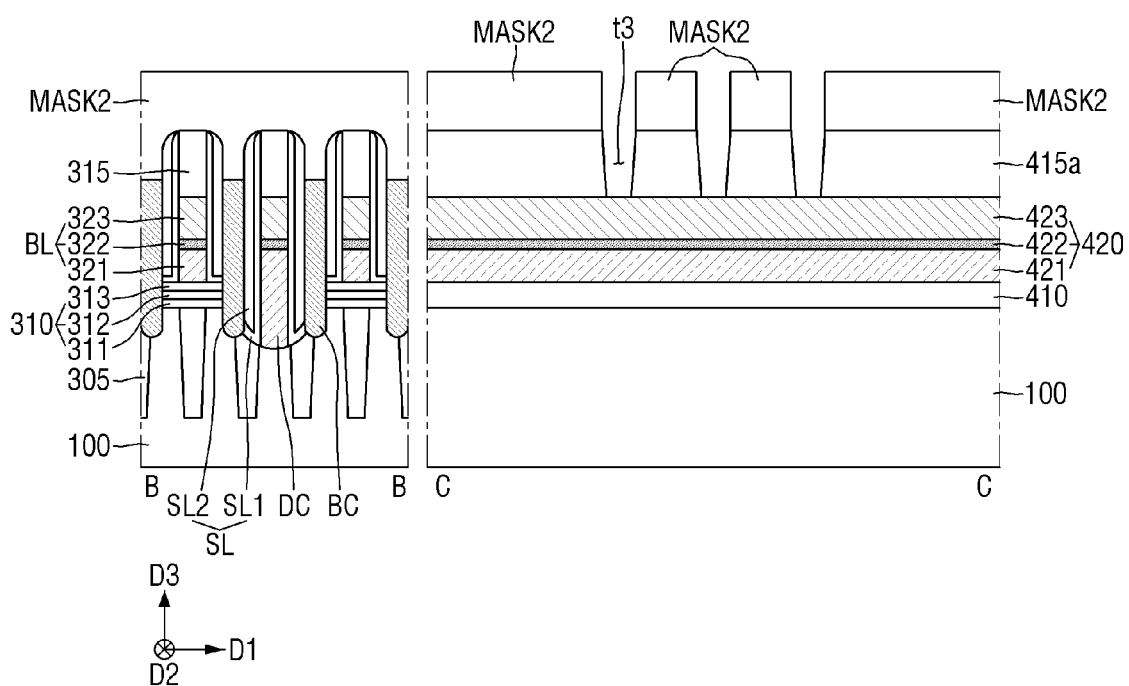

Referring to FIG. 29, a portion of the pre-second peripheral lower insulating layer 415P may be removed using the second mask layer MASK2 as an etching mask.

A portion of the pre-second peripheral lower insulating layer 415P may be removed to form a third trench t3. The third trench t3 may be a trench for forming a peripheral lower electrode. A portion of the pre-second peripheral lower insulating layer 415P may be removed to form the second peripheral lower insulating layer 415a.

Figure 30:
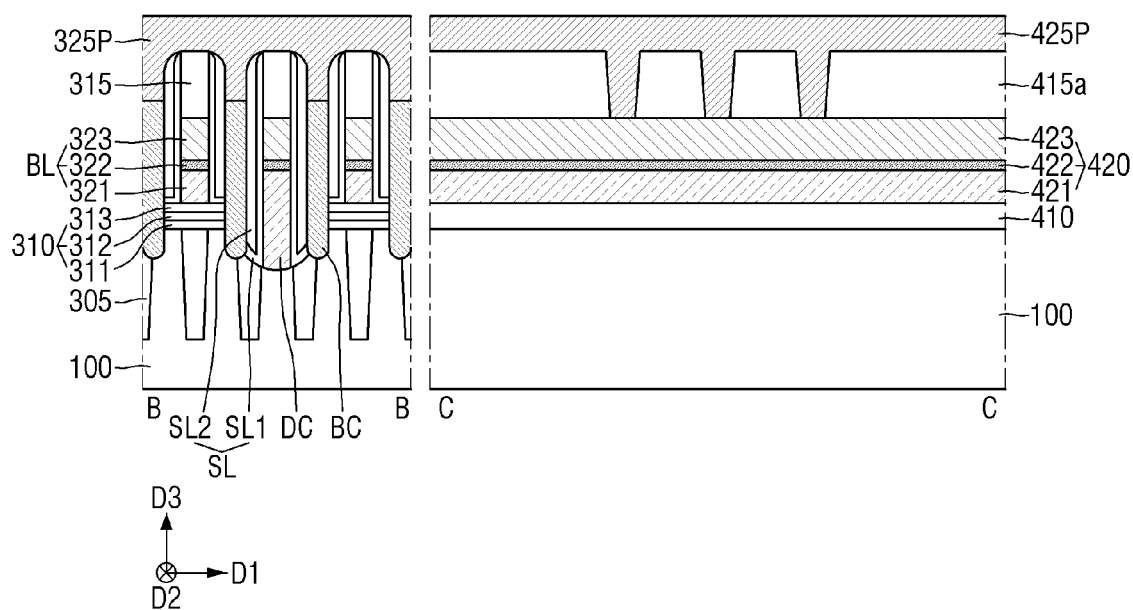

Referring to FIG. 30, the second mask layer MASK2 on the substrate 100 of the cell array region CA and the second mask layer MASK2 on the substrate 100 of the peripheral region PA may be removed.

Subsequently, a pre-landing pad 325P is formed on the substrate 100 of the cell array region CA. A pre-peripheral lower electrode 425P is formed on the substrate 100 of the peripheral region PA.

The pre-landing pad 325P may cover the buried contact BC, the bit line spacer SL and the bit line capping pattern 315. The pre-peripheral lower electrode 425P may fill the third trench t3 and cover the second peripheral lower insulating layer 415a. The pre-landing pad 325P and the pre-peripheral lower electrode 425P may be formed at the same level. Each of the pre-landing pad 325P and the pre-peripheral lower electrode 425P may include tungsten, but is not limited thereto.

Figure 31:
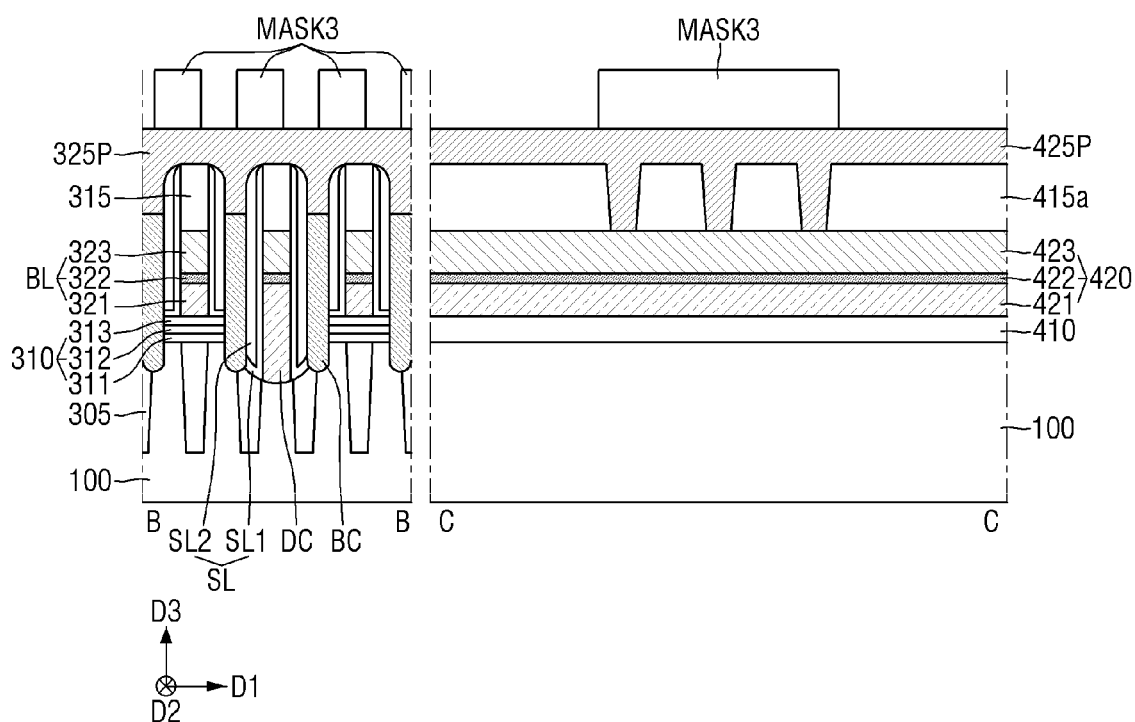

Referring to FIG. 31, a third mask layer MASK3 is formed on the pre-landing pad 325P. In the cell array region CA, the third mask layer MASK3 may have an opening that schematically restricts a position of a pad isolation insulating layer 380.

The third mask layer MASK3 is also formed on the pre-peripheral lower electrode 425P. In the peripheral region PA, the third mask layer MASK3 may have an opening that schematically restricts a position of a second peripheral upper insulating layer 415b. The third mask layer MASK3 may be formed of at least one of, for example, a photoresist layer, an amorphous carbon layer (ACL), a spin on hardmask (SOH), a spin on carbon (SOC) or a silicon nitride layer.

Figure 32:
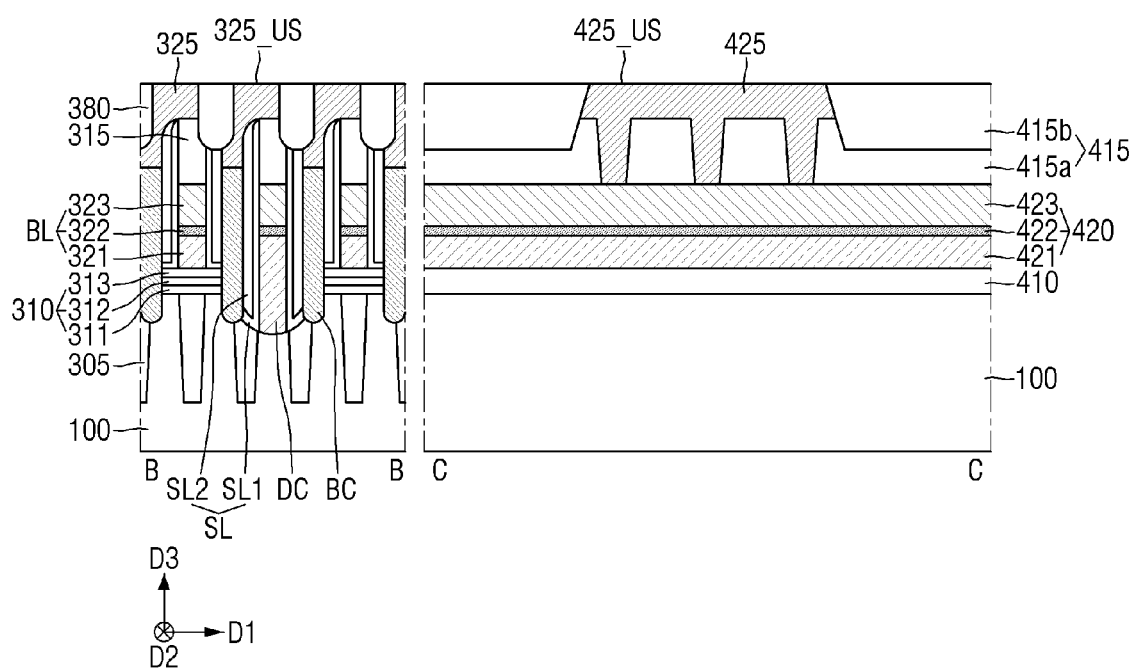

Referring to FIG. 32, the pad isolation insulating layer 380, the second peripheral upper insulating layer 415b, the landing pad 325 and the peripheral lower electrode 425 may be formed using the third mask layer MASK3 as an etching mask.

First of all, a portion of the pre-landing pad 325P, a portion of the bit line spacer SL and a portion of the bit line capping pattern 315 are removed using the third mask layer MASK3 as an etching mask to form the landing pad 325.

The pre-peripheral lower electrode 425P and a portion of the second peripheral lower insulating layer 415a are removed using the third mask layer MASK3 as an etching mask to form the peripheral lower electrode 425.

Subsequently, the pad isolation insulating layer 380 and the second peripheral upper insulating layer 415b are formed. The second peripheral lower insulating layer 415a and the second peripheral upper insulating layer 415b may constitute the second peripheral interlayer insulating layer 415.

Since the landing pad 325 and the peripheral lower electrode 425 are formed at the same level, an upper surface 325_US of the landing pad 325 may be coplanar with an upper surface 425_US of the peripheral lower electrode 425.

Figure 33:
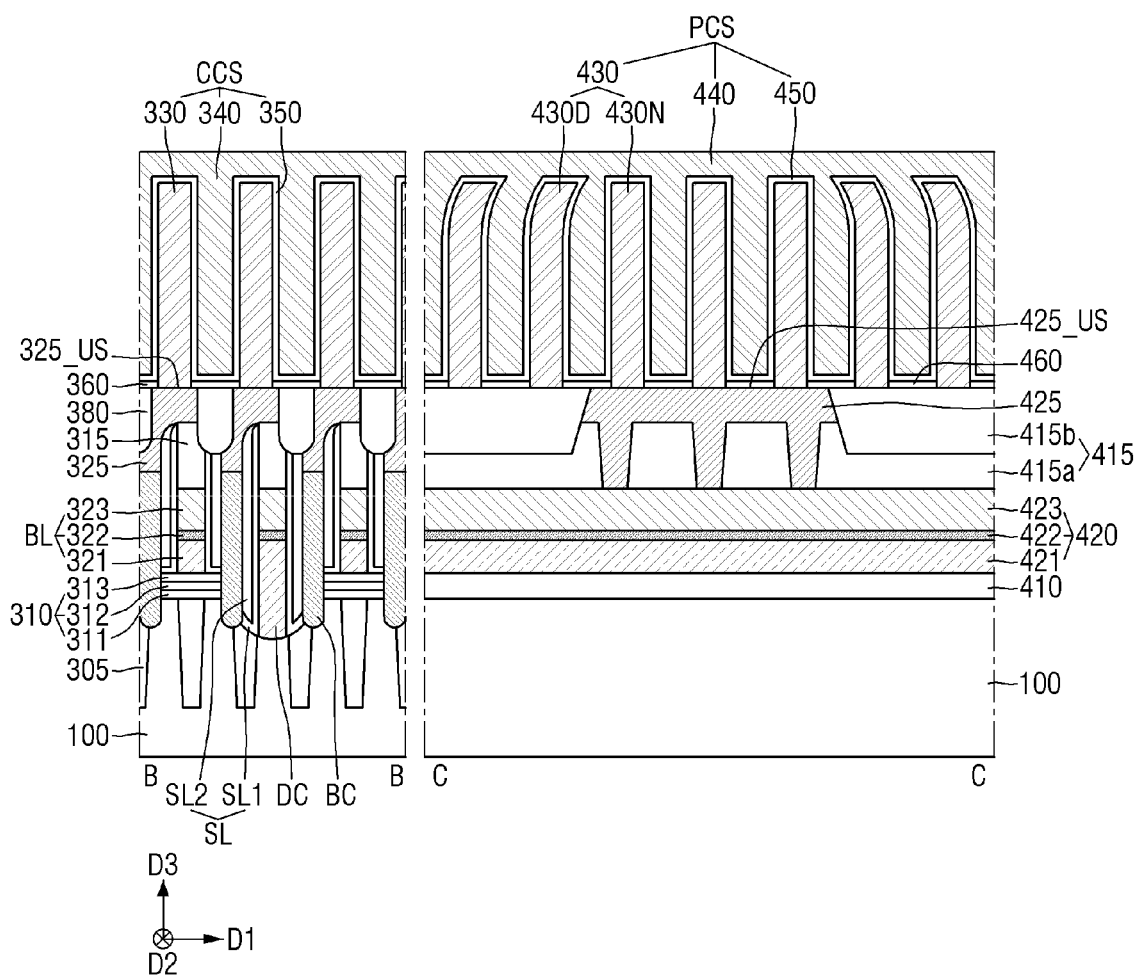

Referring to FIG. 33, on the landing pad 325, a cell capacitor structure CCS is formed. The cell capacitor structure CCS includes a cell storage electrode 330, a cell upper electrode 340, and a cell capacitor dielectric layer 350.

On the peripheral lower electrode 425, a peripheral capacitor structure PCS is formed. The peripheral capacitor structure PCS includes a peripheral storage electrode 430, a peripheral upper electrode 440, and a peripheral capacitor dielectric layer 450.

Although the embodiments according to the present disclosure have been described with reference to the accompanying drawings, the present disclosure can be manufactured in various forms without being limited to the above-described embodiments and the person with ordinary skill in the art to which the present disclosure pertains can understand that the present disclosure can be embodied in other specific forms without departing from the scope of the present disclosure. Thus, the above embodiments are to be considered in all respects as illustrative and not restrictive.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A semiconductor device comprising:
  a substrate;
  a first capacitor structure comprising a plurality of first storage electrodes on the substrate, a first upper electrode on the plurality of first storage electrodes, and a first capacitor dielectric layer between the plurality of first storage electrodes and the first upper electrode;
  a second capacitor structure spaced apart from the first capacitor structure on the substrate, and comprising a plurality of second storage electrodes, a second upper electrode on the plurality of second storage electrodes, and a second capacitor dielectric layer between the plurality of second storage electrodes and the second upper electrode;
  a first lower electrode between the first capacitor structure and the substrate; and
  a second lower electrode between the second capacitor structure and the substrate, and spaced apart from the first lower electrode,
  wherein the plurality of first storage electrodes comprises a first normal storage electrode and a first dummy storage electrode, which are spaced apart from each other, the first normal storage electrode is electrically connected with the first lower electrode, and the first dummy storage electrode is not electrically connected with the first lower electrode, and
  wherein the plurality of second storage electrodes comprises a second normal storage electrode and a second dummy storage electrode, which are spaced apart from each other, the second normal storage electrode is electrically connected with the second lower electrode, and the second dummy storage electrode is not electrically connected with the second lower electrode.

2. The semiconductor device of claim 1, further comprising:
  a common electrode between the first lower electrode and the substrate,
  wherein an area of the common electrode is greater than an area of the first lower electrode in plan view.

3. The semiconductor device of claim 1, wherein the first normal storage electrode and the second normal storage electrode are electrically connected with each other in series.

4. The semiconductor device of claim 1, wherein the first normal storage electrode and the second normal storage electrode are electrically connected with each other in parallel.

5. The semiconductor device of claim 1, further comprising:
  an interlayer insulating layer surrounding the first lower electrode on the substrate,
  wherein an upper surface of the interlayer insulating layer is coplanar with an upper surface of the first lower electrode, and wherein the first dummy storage electrode is directly on the upper surface of the interlayer insulating layer.

6. The semiconductor device of claim 1, wherein the first dummy storage electrode is electrically floating.

7. The semiconductor device of claim 1, wherein the first dummy storage electrode comprises a first surface facing the substrate, and a second surface opposite the first surface, and
  a center of the first surface and a center of the second surface are misaligned in a vertical direction.

8. The semiconductor device of claim 7, wherein a slope of the first dummy storage electrode with respect to the first surface comprises a portion that is gradually reduced toward the second surface.

9. The semiconductor device of claim 1, wherein the first dummy storage electrode comprises a first portion, and a second portion on the first portion, and
  wherein a slope of the first portion and a slope of the second portion are different from each other, and the second portion is closer to the first normal storage electrode than the first portion.

10. A semiconductor device comprising:
  a substrate comprising a first region and a second region surrounding the first region;
  a capacitor structure comprising a plurality of storage electrodes on the substrate, an upper electrode on the plurality of storage electrodes, and a capacitor dielectric layer between the plurality of storage electrodes and the upper electrode; and
  a lower electrode between the capacitor structure and the first region of the substrate and electrically connected with the capacitor structure,
  wherein the plurality of storage electrodes comprises a normal storage electrode on the first region of the substrate and electrically connected with the lower electrode, and a dummy storage electrode on the second region of the substrate and electrically floating.

11. The semiconductor device of claim 10, further comprising:
  a common electrode between the lower electrode and the substrate,
  wherein an area of the common electrode is greater than an area of the lower electrode in plan view.

12. The semiconductor device of claim 11, wherein the common electrode comprises a portion that does not overlap with the upper electrode in a vertical direction.

13. The semiconductor device of claim 10, further comprising:
  an interlayer insulating layer on the second region of the substrate,
  wherein the dummy storage electrode is directly on the interlayer insulating layer.

14. The semiconductor device of claim 10, wherein the dummy storage electrode comprises a first surface facing the substrate and a second surface opposite the first surface, and
  a center of the first surface and a center of the second surface are misaligned in a vertical direction.

15. The semiconductor device of claim 10, wherein the dummy storage electrode comprises a first portion, and a second portion on the first portion, and
  wherein a slope of the first portion and a slope of the second portion are different from each other, and the second portion is closer to the normal storage electrode than the first portion.

16. A semiconductor device comprising:
  a substrate comprising a cell array region and a peripheral region;

bit lines on and crossing the cell array region of the substrate;

a buried contact between the bit lines and electrically connected with the cell array region of the substrate;

a landing pad on the buried contact;

a cell capacitor structure on and electrically connected with the landing pad;

a peripheral capacitor structure comprising a plurality of peripheral storage electrodes on the peripheral region of the substrate, a peripheral upper electrode on the plurality of peripheral storage electrodes, and a peripheral capacitor dielectric layer between the plurality of peripheral storage electrodes and the peripheral upper electrode;

a peripheral lower electrode between the peripheral capacitor structure and the peripheral region of the substrate and electrically connected with the peripheral capacitor structure; and a peripheral common electrode between the peripheral lower electrode and the peripheral region of the substrate, wherein an area of the peripheral lower electrode is smaller than an area of the peripheral common electrode in plan view, wherein the plurality of peripheral storage electrodes comprises a peripheral normal storage electrode and a peripheral dummy storage electrode, which are spaced apart from each other, and wherein the peripheral normal storage electrode is electrically connected with the peripheral lower electrode, and the peripheral dummy storage electrode is not electrically connected with the peripheral lower electrode.

17. The semiconductor device of claim 16, wherein a stacked structure of the bit lines and a stacked structure of the peripheral common electrode are the same as each other.

18. The semiconductor device of claim 16, wherein an upper surface of the landing pad and an upper surface of the peripheral lower electrode are coplanar with each other.

19. The semiconductor device of claim 16, wherein the cell capacitor structure comprises a plurality of cell storage electrodes, a cell upper electrode on the plurality of cell storage electrodes, and a cell capacitor dielectric layer between the plurality of cell storage electrodes and the cell upper electrode, and wherein a height of the cell storage electrode in a vertical direction is the same as a height of the peripheral normal storage electrode in the vertical direction.

* * * * *